(12) United States Patent
Sheppard

(10) Patent No.: US 12,162,264 B2
(45) Date of Patent: Dec. 10, 2024

(54) SCREEN LOADING SYSTEM

(71) Applicant: ASMPT SMT SINGAPORE PTE. LTD., Singapore (SG)

(72) Inventor: Christopher Sheppard, Weymouth (GB)

(73) Assignee: ASMPT SMT SINGAPORE PTE. LTD., Singapore (SG)

(*) Notice: Subject to any disclaimer, the term of this patent is extended or adjusted under 35 U.S.C. 154(b) by 11 days.

(21) Appl. No.: 17/775,424

(22) PCT Filed: Nov. 12, 2020

(86) PCT No.: PCT/IB2020/060641
§ 371 (c)(1),
(2) Date: May 9, 2022

(87) PCT Pub. No.: WO2021/094962
PCT Pub. Date: May 20, 2021

(65) Prior Publication Data
US 2022/0410558 A1 Dec. 29, 2022

(30) Foreign Application Priority Data
Nov. 13, 2019 (GB) .................. 1916469

(51) Int. Cl.
*H05K 3/12* (2006.01)
*B41F 15/36* (2006.01)

(52) U.S. Cl.
CPC .......... *B41F 15/36* (2013.01); *H05K 3/1225* (2013.01); *B41P 2215/12* (2013.01); *H05K 2203/0169* (2013.01)

(58) Field of Classification Search
CPC ............ B41C 1/14; B41F 15/34; B41F 15/36; B41M 1/12; B41N 1/248; B41P 2215/10;
(Continued)

(56) References Cited

U.S. PATENT DOCUMENTS 5,606,911 A 3/1997 Cane
5,606,912 A 3/1997 Cane
(Continued)

FOREIGN PATENT DOCUMENTS

CN 101855086 A 10/2010
EP 3 450 170 A1 3/2019
(Continued)

OTHER PUBLICATIONS

International Search Report mailed Mar. 1, 2021 in corresponding PCT International Application No. PCT/IB2020/060641.
(Continued)

*Primary Examiner* — Christopher E Mahoney
*Assistant Examiner* — Marissa Ferguson-Samreth
(74) *Attorney, Agent, or Firm* — OSTROLENK FABER LLP

(57) ABSTRACT

A tensioning frame (22) for tensioning a printing screen (3) comprises a plurality of elongate beams (30A-30D) which extend around the periphery of the printing screen (3) and define the tensioning frame (22), wherein at least one of the beams (30A-30D) comprises an opening (32) which is dimensioned to permit a printing screen (3) to be received therethrough, in a lateral direction (A). Mechanisms are described for engagement of the tensioning screen (22) and printing screen (3), as well as an apparatus and a method permitting the lateral loading of the printing screen (3).

16 Claims, 26 Drawing Sheets

(58) Field of Classification Search
CPC ............. B41P 2215/12; B41P 2215/50; H05K 3/1225; H05K 2203/0169
See application file for complete search history.

(56) References Cited

U.S. PATENT DOCUMENTS

| | | | |
|---|---|---|---|
| 5,941,171 A | 8/1999 | Fromm | |
| 6,038,696 A | 3/2000 | Chouly | |
| 6,067,903 A | 5/2000 | Williams | |
| 6,289,804 B1 | 9/2001 | Williams | |
| 6,450,091 B1 | 9/2002 | Bourrieres et al. | 101/127.1 |
| 8,342,089 B2 | 1/2013 | Cane et al. | |
| 9,358,774 B1 * | 6/2016 | Niswonger | B44D 3/185 |
| 10,800,157 B2 | 10/2020 | Choi | |
| 10,814,613 B2 | 10/2020 | Choi | |
| 11,420,435 B1 * | 8/2022 | Simionescu | H05K 3/1225 |
| 2013/0074715 A1 | 3/2013 | Chen | |
| 2017/0080738 A1 | 3/2017 | Bailey et al. | |

FOREIGN PATENT DOCUMENTS

| | | |
|---|---|---|
| EP | 3482939 A1 | 5/2019 |
| GB | 2455493 A | 6/2009 |
| GB | 2526536 A | 12/2015 |
| JP | U58-175057 | 11/1983 |
| JP | 2001-253043 A | 9/2001 |
| JP | 2012-505767 A | 3/2012 |
| JP | 2019-514736 A | 6/2019 |
| TW | 201932312 A | 8/2019 |
| WO | WO 03/093012 A1 | 11/2003 |
| WO | WO 2005/046994 A2 | 5/2005 |
| WO | WO 2007/091035 A1 | 8/2007 |
| WO | WO 2009/047012 A2 | 4/2009 |
| WO | WO 2017/164493 A1 | 9/2017 |
| WO | WO 2017/188555 A1 | 11/2017 |
| WO | WO 2019/092194 A1 | 5/2019 |
| WO | WO 2019/103284 A1 | 5/2019 |

OTHER PUBLICATIONS

Written Opinion mailed Mar. 1, 2021 in corresponding PCT International Application No. PCT/IB2020/060641.

* cited by examiner

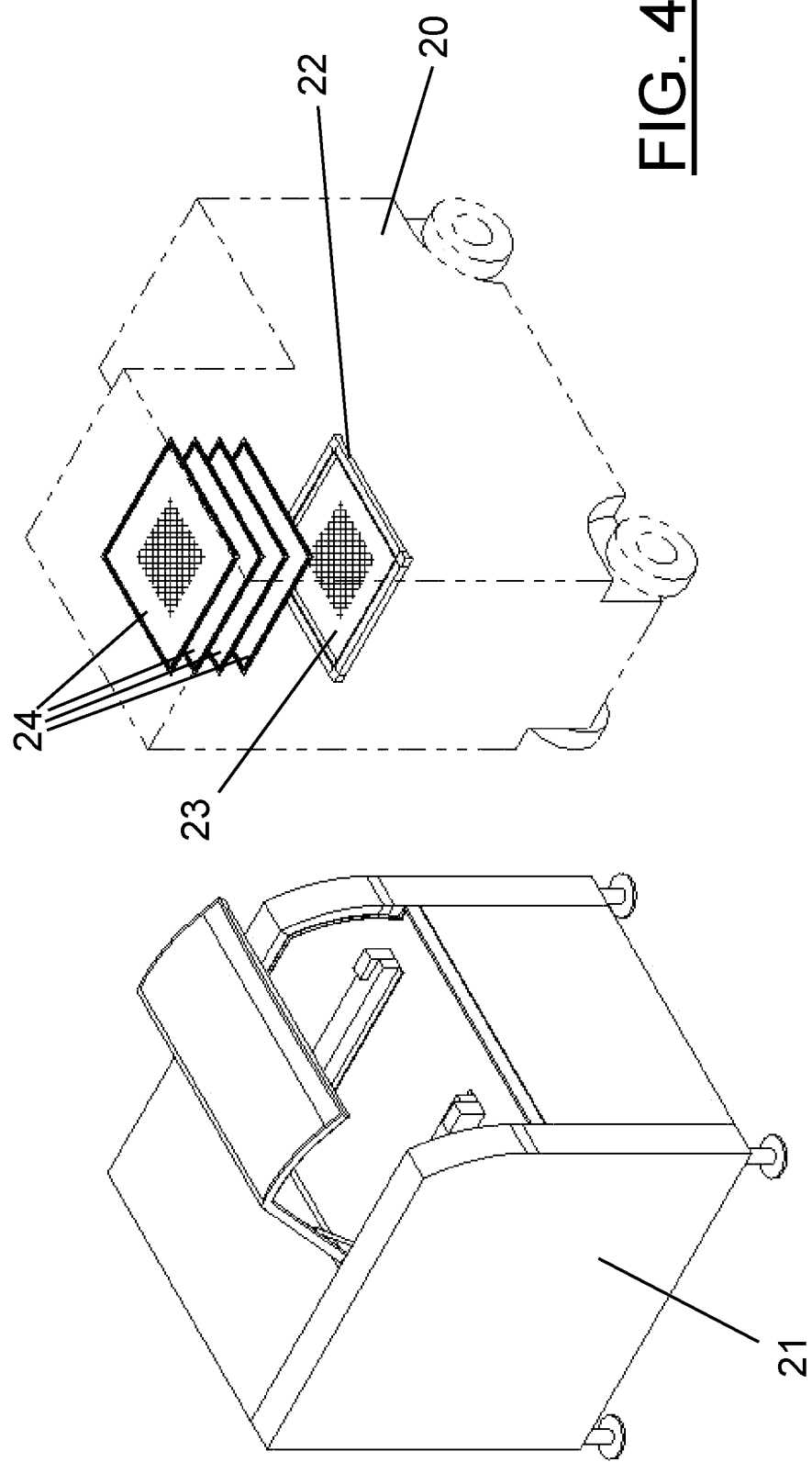

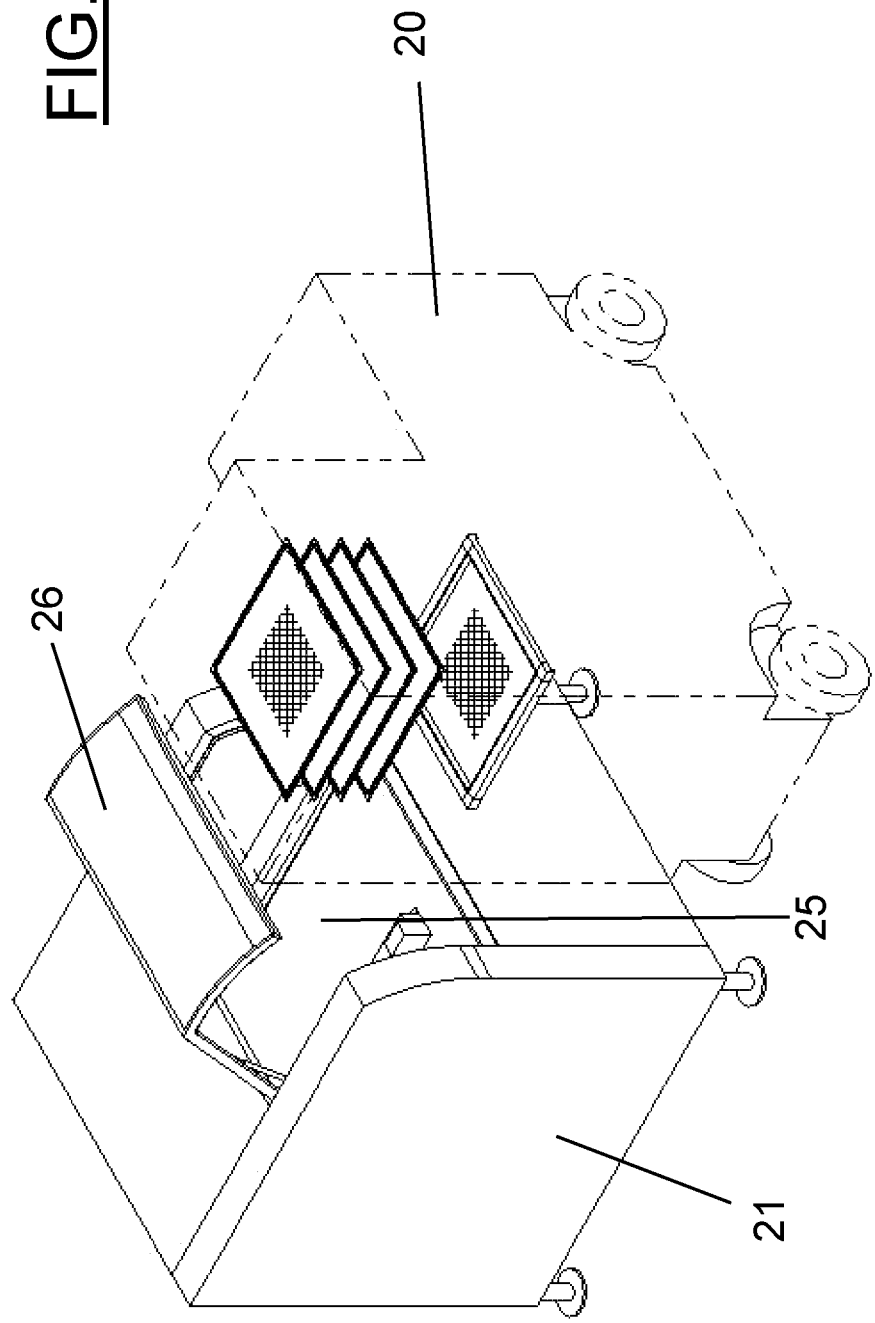

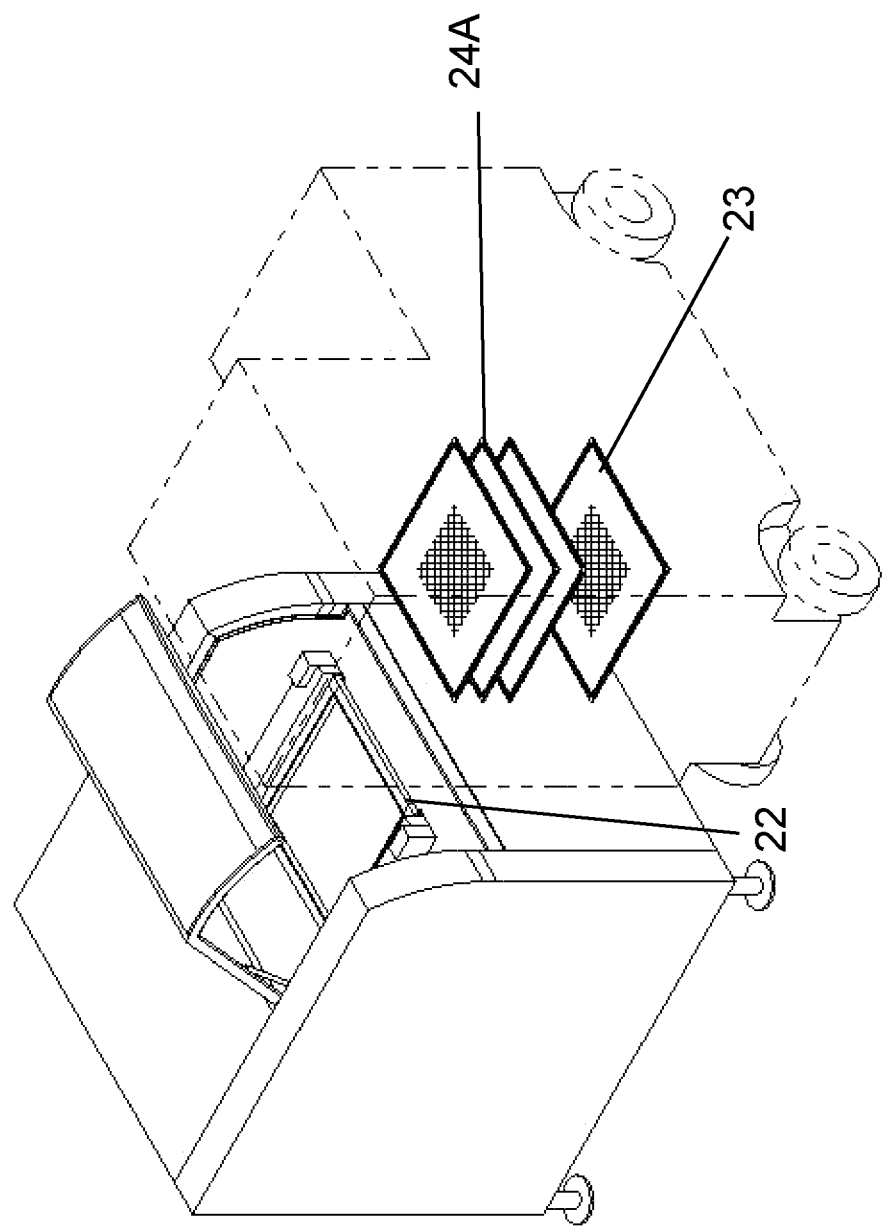

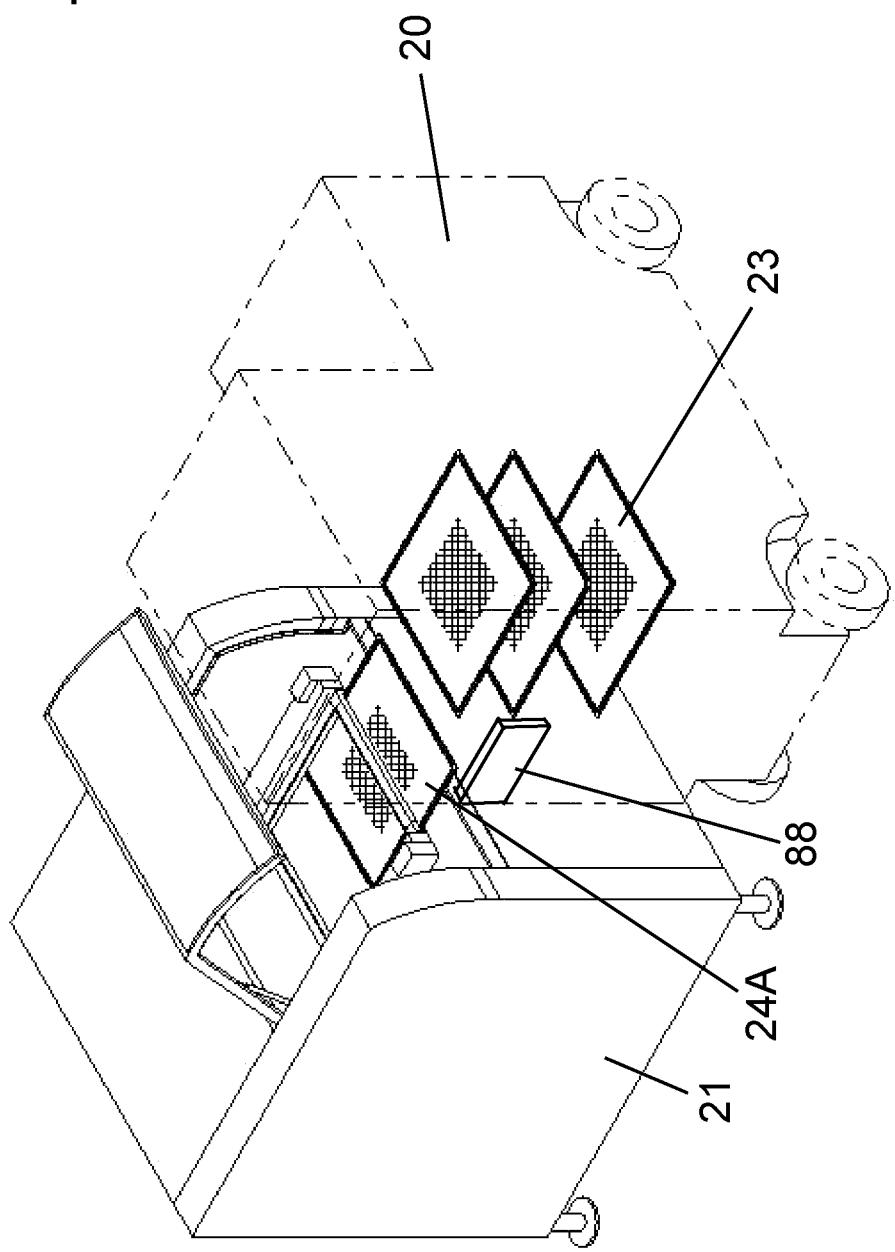

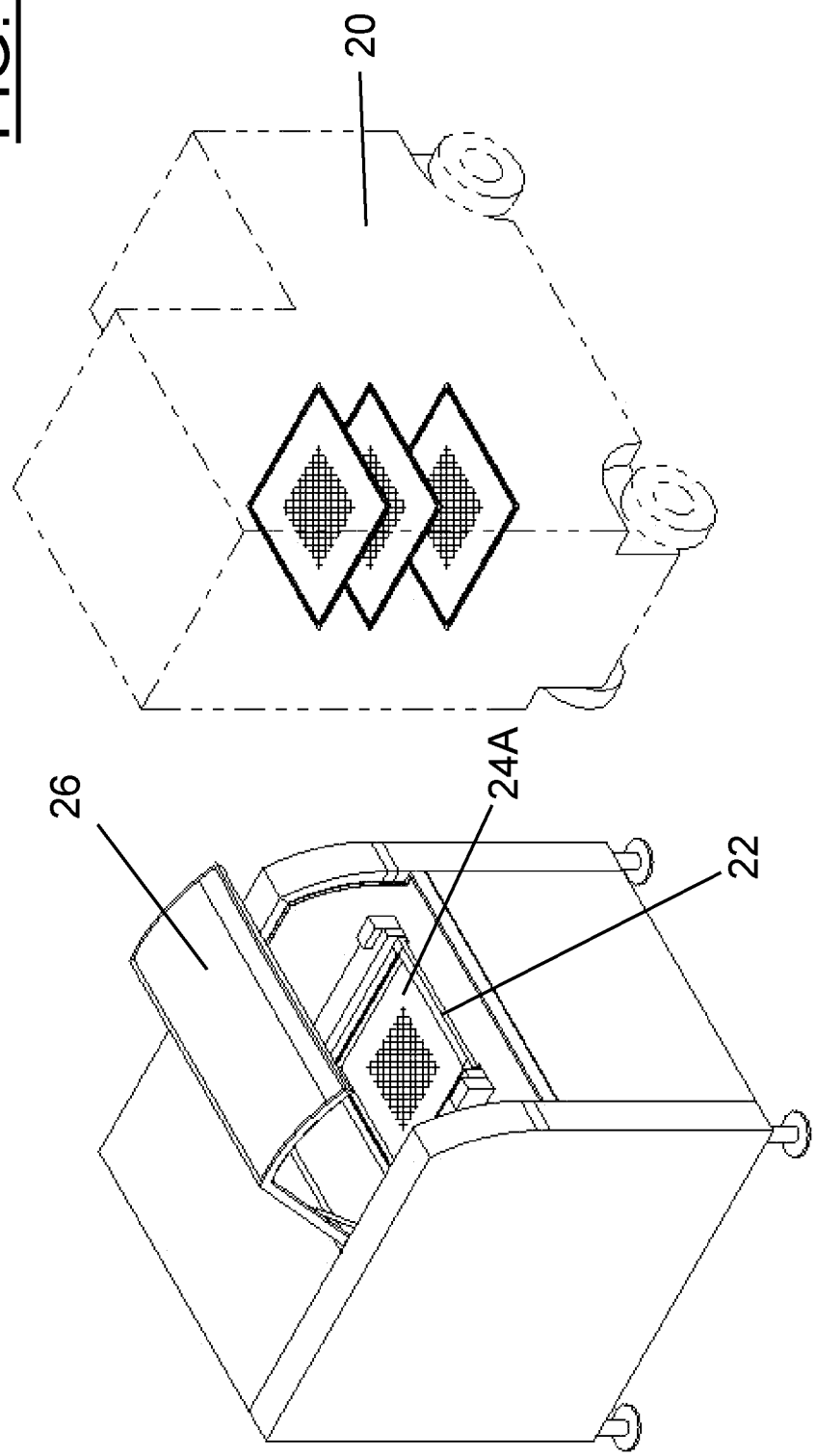

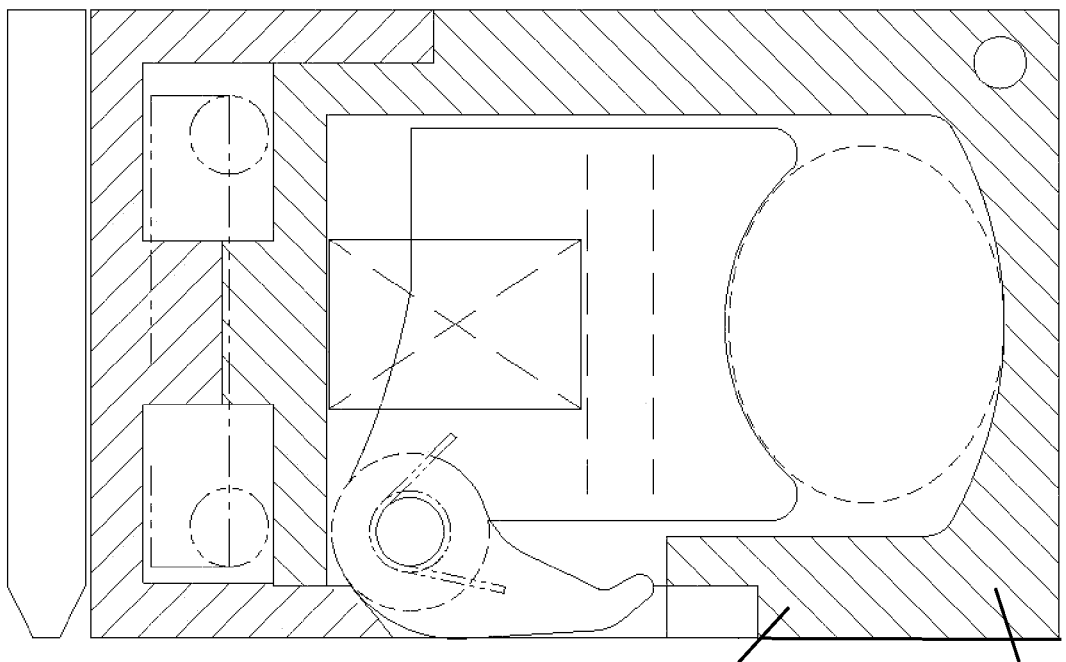
FIG. 11
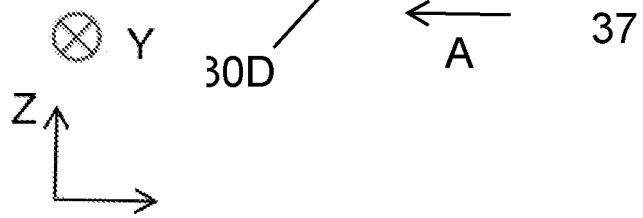
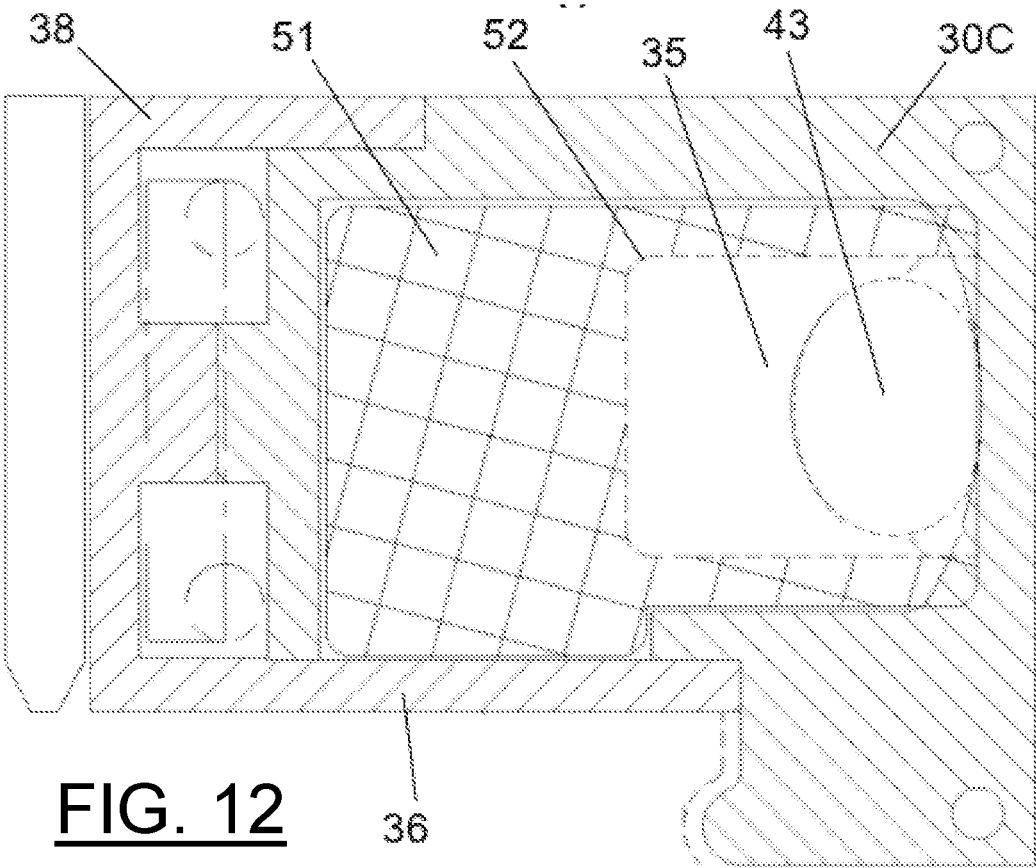
FIG. 12

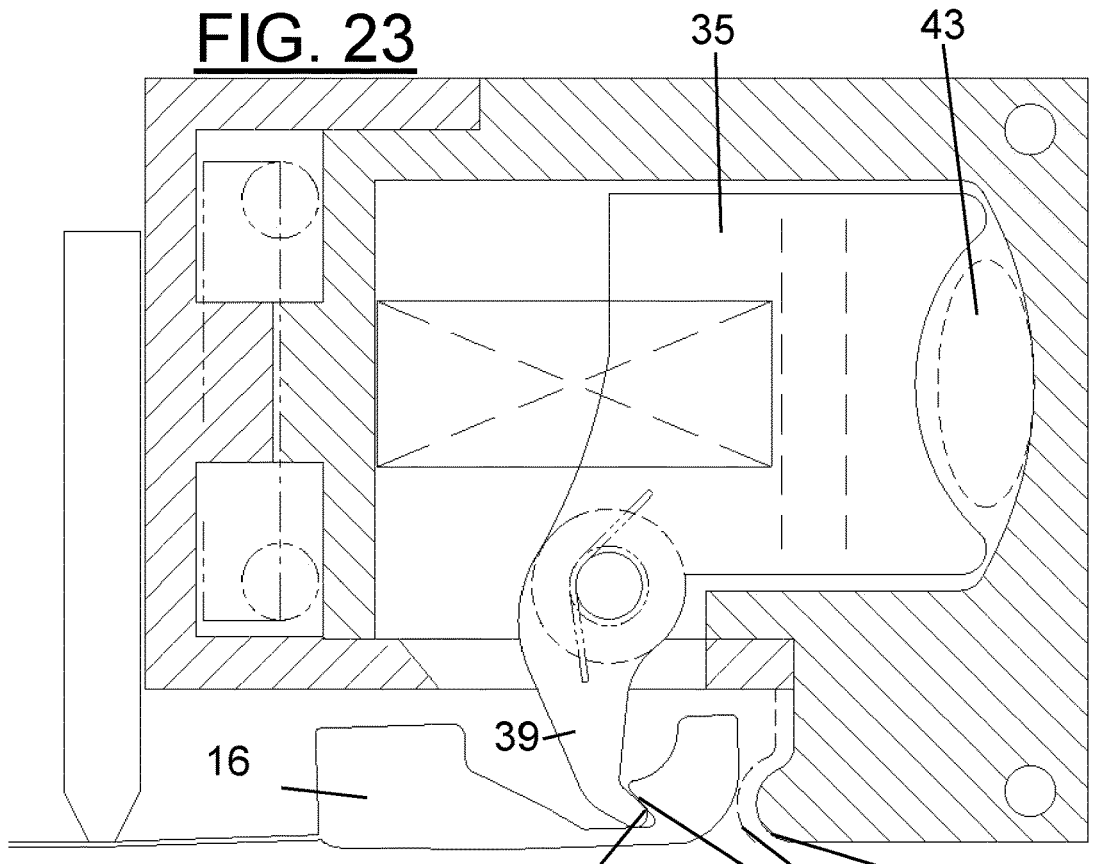
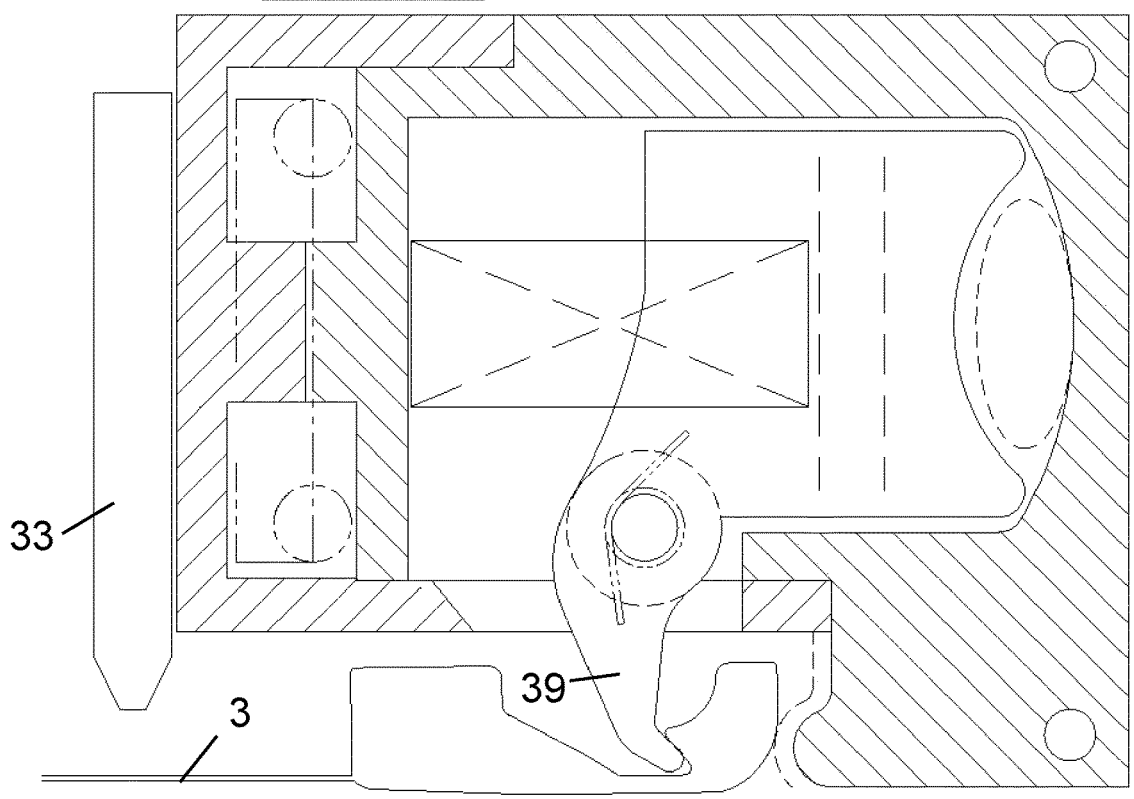

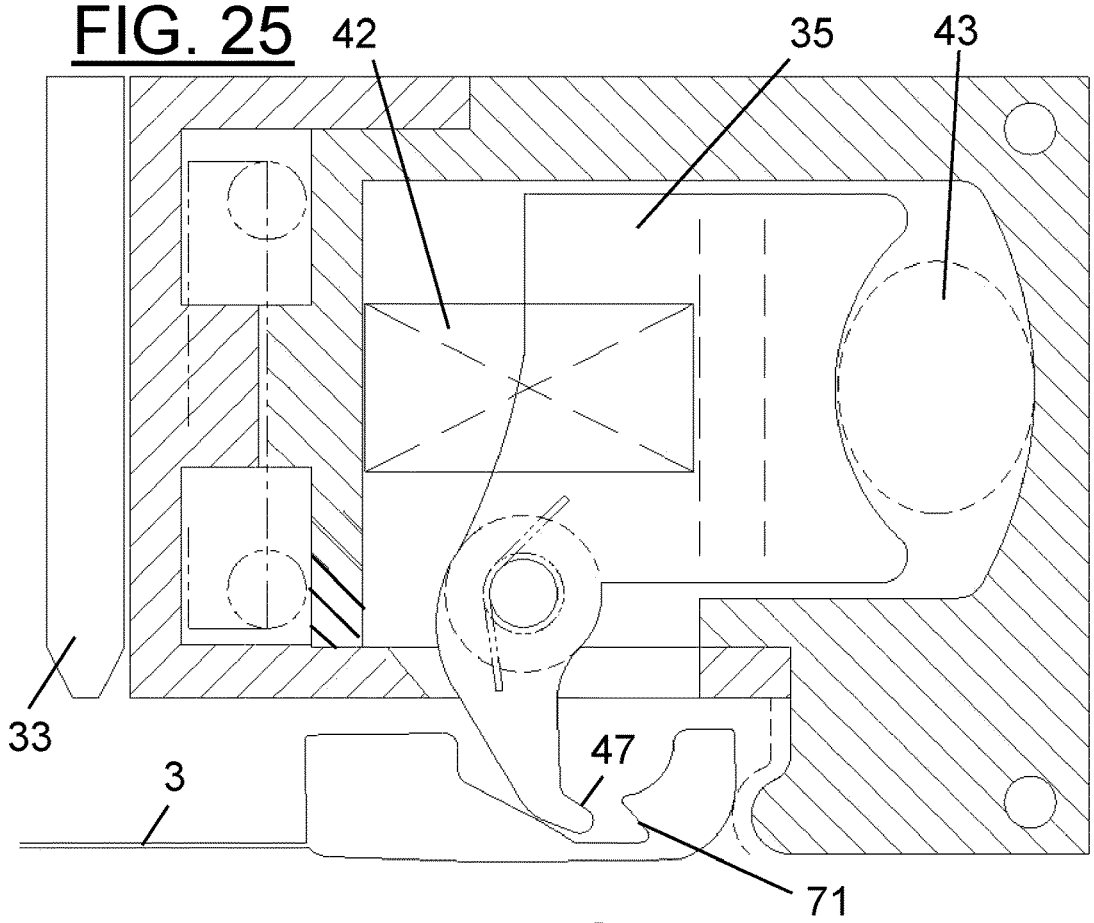
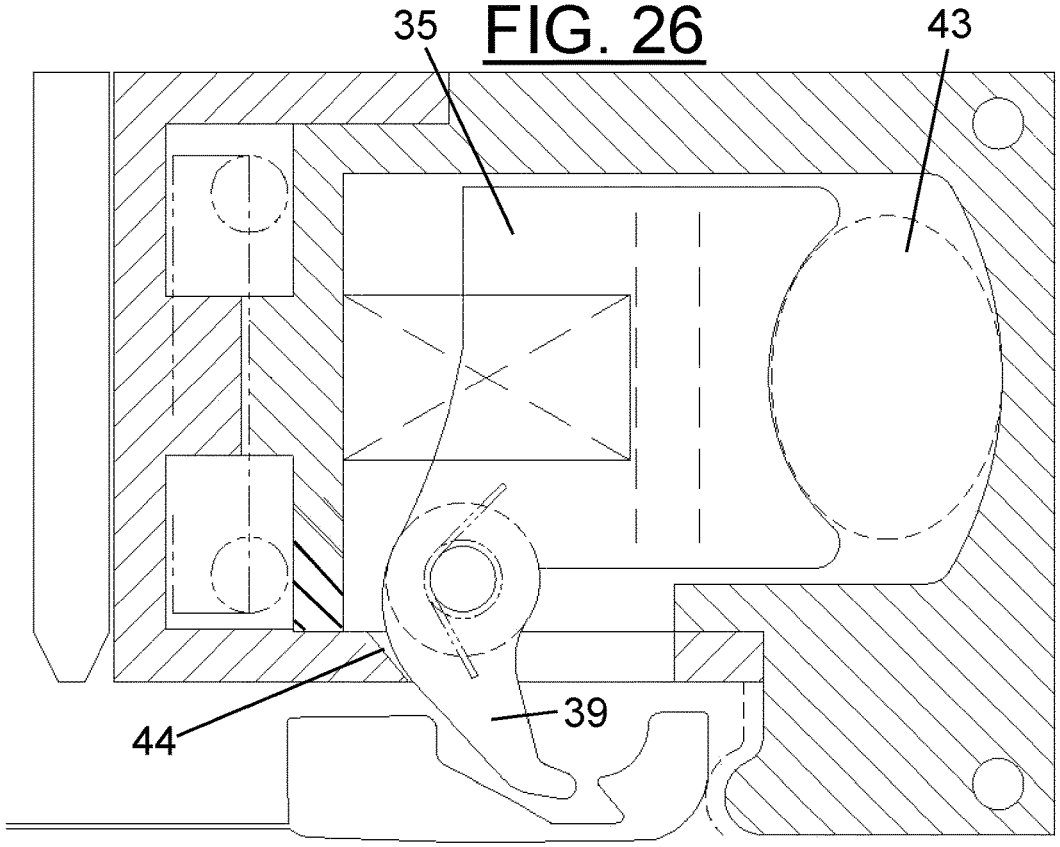

SCREEN LOADING SYSTEM

CROSS-REFERENCE TO RELATED APPLICATIONS

The present application is a 35 U.S.C. §§ 371 national stage application of PCT/IB2020/060641, filed Nov. 12, 2020, which claims priority to United Kingdom Patent Application No. 1916469.8, filed Nov. 13, 2019, the contents of which are incorporated herein by reference. The PCT International Application was published in the English language.

This invention relates to tensioning frames for tensioning a printing screen, a method of loading a printing screen into a tensioning frame and a robot for loading a printing screen into a tensioning frame.

BACKGROUND AND PRIOR ART

Industrial screen-printing machines typically apply a conductive print medium, such as solder paste or conductive ink, onto a planar workpiece, such as a circuit board, by applying the conductive print medium through a pattern of apertures in a printing screen (sometimes referred to as a mask or stencil) using an angled blade or squeegee.

A printing screen is a substantially planar sheet which before use is cut to include apertures which define the pattern to be printed. In one common form it comprises a screen sheet formed of metal or plastics material, while in another common form comprises a mesh comprising a flexible, perforate sheet, for example a woven mesh of polypropylene or stainless steel strands. In both forms it is necessary to hold the printing screen under tension during a printing operation, and conventionally this is achieved by removably attaching the printing screen to a rectangular tensioning frame. There are various such tensioning frames and methods for providing engagement between a printing screen and a tensioning frame, with one well-known example being the VectorGuard® system, which is described in WO-2003093012-A1, WO-2005046994-A2, WO-2007091035-A1, WO-2009047012-A2 and GB-2526536-A. Other systems are described in, for example, U.S. Pat. Nos. 5,606,911, 5,606,912, 5,941,171, 6,038,969, 6,067,903, 6,289,804, WO-2017164493-A1, WO-2017188555-A1, WO-2019103284-A1.

FIG. 1 schematically shows, in perspective view, the underside of a known VectorGuard tensioning frame 1, FIG. 2 schematically shows, in perspective view, a known printing screen 3 adapted for engagement with the VectorGuard tensioning frame 1 of FIG. 1, while FIG. 3 schematically shows a cross-section of a beam 2A of the VectorGuard tensioning frame in engagement with a printing screen 3. As can be seen from FIG. 1, the tensioning frame 1 is planar and defined by a plurality (here four) of elongate beams 2A-D which extend around the periphery of the tensioning frame 1, forming a rectangle, which in use may surround and tension a printing screen 3. The beams are identical in construction. Adjacent beams 2 are connected by corner pieces 4, one of which also includes a pneumatic port 6. Each beam includes a number of engagement surfaces 5, for engaging with a printing screen 3 in use. As can be seen in FIG. 1, the individual engagement surfaces 5 of each beam 2 are adjacent, and together form a composite engagement surface. With particular reference to FIG. 3, it can be seen that each beam (here beam 2A is shown) is hollow, comprising an elongate channel formed therein, the channel extending parallel to the length of the respective beam 2 and having an opening 6 at an engagement side (i.e. the underside) thereof, the engagement side of each beam 2 being co-planar and orientated parallel to the plane of the frame 1. The beam 2 is therefore approximately U-shaped in cross-section. Located within the channel is an engagement body 7 with three approximately radially-extending arms: a first arm 8 engages with a biasing member, here a spring 9, located between the arm 8 and an inner surface of the beam 2A; a second arm 10 which engages with a pneumatically inflatable tubing 11 located between the arm 10 and an inner surface of the beam 2A and which is connected to pneumatic port 13; and a third arm 12 carrying engagement surface 5. The engagement body 7 is mounted for rotation about a spindle 14 which is an integral part of the beam 2, with the rotation controlled by the inflation of tubing 11, acting against the bias of spring 9. The third arm 12 is sized so that the engagement surface 5 projects outwardly of the beam from the channel opening 6, during at least part of the engagement surface's range of travel during rotation of the engagement body. To tension a printing screen 3, the tubing 11 is first inflated to rotate the engagement body 7 clockwise as shown and thus move engagement surface 5 to the left as shown, and slightly retracted into the channel. A printing screen 3, which as shown in FIG. 2 has a patterned foil or mesh 15 and a supporting edging 16, which includes edging corner pieces 161, is then positioned proximate the underside of the frame 1. Pneumatic pressure is then released from tubing 11, which deflates, allowing the engagement body 7 to rotate anticlockwise as shown under the biasing force of spring 9, so that the engagement surface 5 moves to the right as shown, and slightly outwardly, to engage with a corresponding inclined profile of the edging 16, thus applying a tensioning force to the printing screen 3.

Each beam 2 includes a projection 17 located on the inner side, i.e. that side which faces the interior of the tensioning frame 1, which projects towards the printing screen 3 in use, i.e. downwardly as shown. The distal end of the projection 17 forms an abutment surface 18. When a printing screen 3 is located into the tensioning frame 1 and tension applied thereto by engagement of the engagement surfaces 5 and the edging 16, it can be seen that the rotary movement of the engagement surfaces 5 will cause the edging 16 to move both laterally away from the centre of the tensioning frame 1, thus increasing tension in the printing screen 3, and also slightly upwards towards the centre of the beams 2. This vertical movement causes the foil/mesh 15 to lift into contact with the abutment surface 18. It can be seen therefore that together, the abutment surfaces 18 of each beam 2 act as a bearing edge and define the plane of the tensioned foil/mesh 15 in use.

In practice, the VectorGuard tensioning frame is manufactured by forming each beam 2, and each engagement body 7, as metal extrusions. Each engagement body 7 may then be slid onto the spindle 14 from and end of the beam 2, and springs 9 and the tubing 11 are also inserted at one end of the beam and slid along to the intended position.

The VectorGuard system in particular provides simple, consistent and reliable operation, leading to its widespread uptake in the industry.

However, a problem exists with such known apparatus in that it is difficult to automate the loading of a printing screen into the tensioning frame and subsequently into a printing machine.

To load a printing screen 3 into the tensioning frame 1, it is recommended to place the tensioning frame 1 upside down on a flat surface such as a table. Pneumatic pressure is applied to the tensioning frame 22 to inflate tubing 11 and thus retract the arm 12 into the channel. A printing screen 3 may then be placed onto the underside of the tensioning frame 1 and the pneumatic pressure turned off. The arm 12 may then move under the action of spring 9 to engage with the edging 16 of the printing screen 3 and tension the screen. This also serves to centre the printing screen 3 relative to the tensioning frame 1. The loaded tensioning frame 1 may then be turned right side up, and the loaded frame placed into a printing machine for use in a printing operation. The loading of the tensioning frame 1 therefore requires two separate inversions of the frame, together with an intermediate screen positioning step, followed by a separate machine loading step.

The present invention seeks to provide a new form of tensioning frame, which may for example be compatible with VectorGuard printing screens, which permits cartridge-style side-loading of printing screens into the tensioning frame. In this way, the printing screen may be loaded, for example by a robot such as an autonomous intelligent vehicle, into a tensioning frame, without removing the frame from a printing machine, greatly streamlining the loading processes.

In accordance with the present invention this aim is achieved by providing a side opening in the tensioning frame to receive a printing screen, and by moving various components of the tensioning frame between loading and operational positions, to facilitate such loading.

SUMMARY OF THE INVENTION

In accordance with a first aspect of the present invention there is provided a tensioning frame for tensioning a printing screen, the tensioning frame comprising a plurality of elongate beams which extend around the periphery of the tensioning frame and define the tensioning frame, the tensioning frame being substantially planar, wherein at least one of the beams comprises an opening which is dimensioned to permit a printing screen to be received therethrough.

In accordance with a second aspect of the present invention there is provided a tensioning frame for tensioning a printing screen, the tensioning frame comprising a plurality of elongate beams which extend around the periphery of the tensioning frame and define the tensioning frame, the tensioning frame being substantially planar, each beam comprising:

an engagement body at least partially located within the beam, the engagement body carrying an engagement arm for engaging with a printing screen in use, the engagement body being movable with respect to the beam along a range of travel in a plane normal to the length of the beam, and an actuator operatively connected to the engagement body for moving the engagement body, and hence engagement arm, relative to the beam, wherein the engagement arm is movably mounted to a respective engagement body.

In accordance with a third aspect of the present invention there is provided a method of loading a printing screen into a tensioning frame, comprising the steps of:

i) providing a tensioning frame, and ii) inserting a printing screen into the tensioning frame through a side thereof.

In accordance with a fourth aspect of the present invention there is provided a robot for loading a printing screen into a tensioning frame, comprising:

a printing screen storage magazine for storing at least one printing screen, and a transfer mechanism for transferring a printing screen from the printing screen storage magazine laterally into a tensioning frame.

Other specific aspects and features of the present invention are set out in the accompanying claims.

BRIEF DESCRIPTION OF THE DRAWINGS

The invention will now be described with reference to the accompanying drawings (not to scale), in which:

FIGS. 4A-J show, in perspective view, a loading sequence using a tensioning frame in accordance with an embodiment of the present invention;

FIG. 11 schematically shows a sectional view of beam 30D;

FIG. 12 schematically shows a sectional view of beam 30C taken along the line C-C of FIG. 5;

FIGS. 20 to 23 schematically show a sectional view of beam 30C at various stages of a printing screen loading sequence;

FIGS. 24 to 27 schematically show a sectional view of beam 30C at various stages of a printing screen unloading sequence.

DETAILED DESCRIPTION OF THE PREFERRED EMBODIMENTS OF THE INVENTION

A. Exemplary Loading to and Unloading from a Printing Machine

Before describing the construction of a tensioning frame in accordance with the invention, an exemplary loading/unloading sequence to provide a printing machine with a printing screen according to an embodiment of the present invention will be described with reference to FIGS. 4A-4J, which demonstrates the new functionality made possible with such a tensioning frame.

Figure 1:
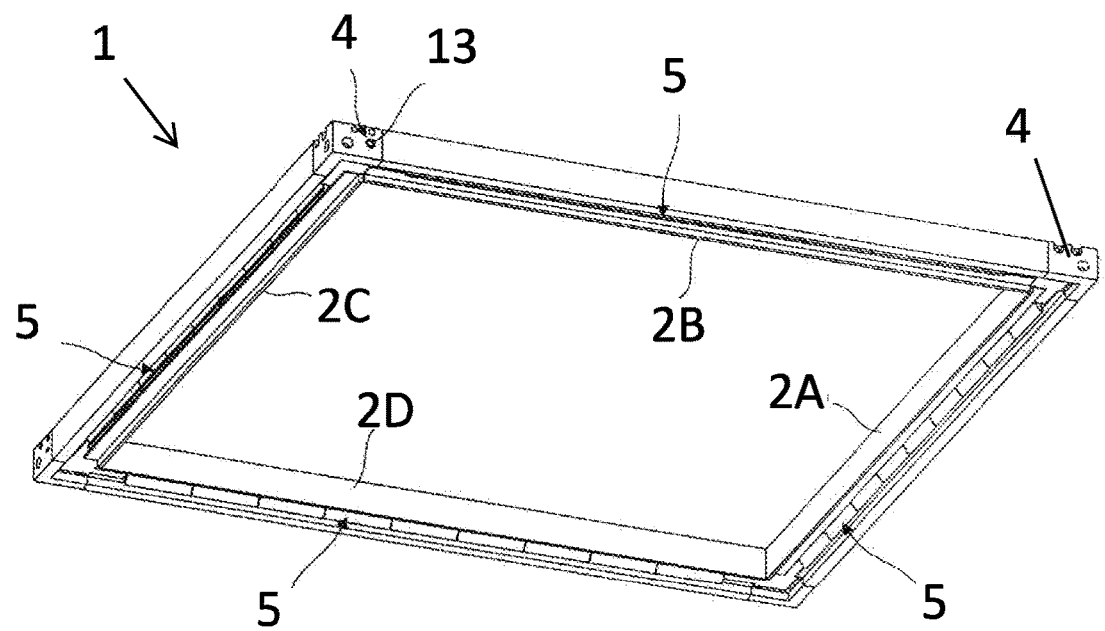
FIG. 1 schematically shows, in perspective view, the underside of a known tensioning frame.
Figure 2:
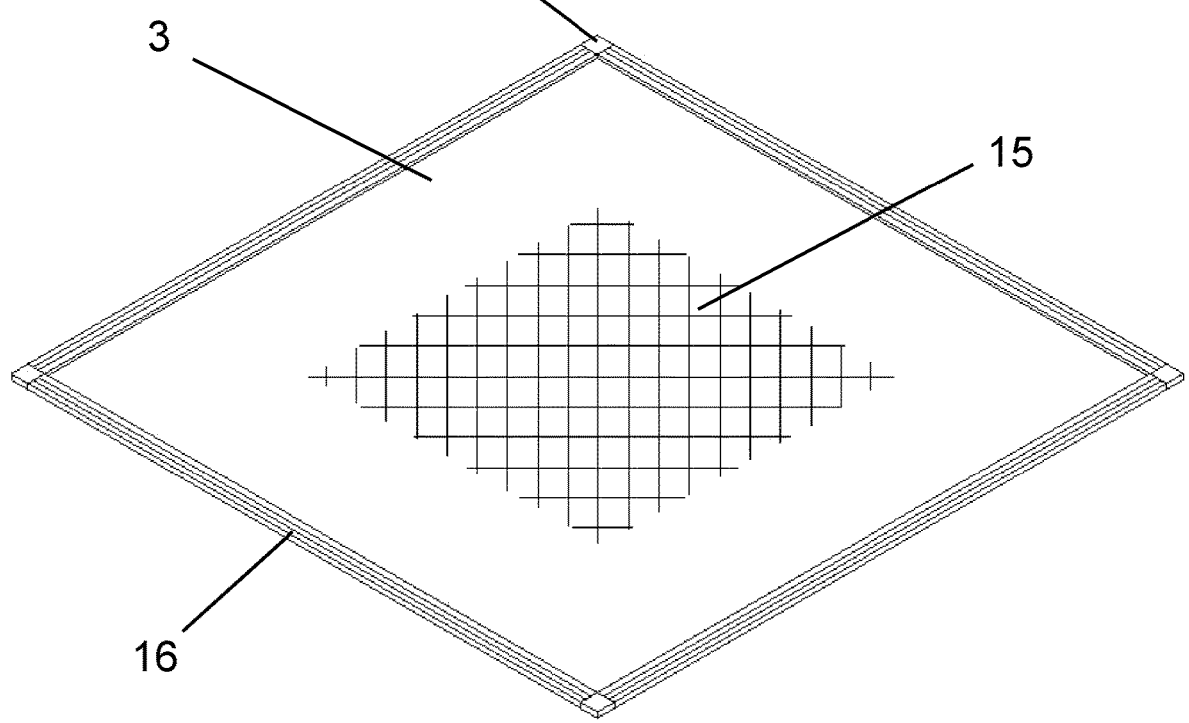
FIG. 2 schematically shows, in perspective view, a known printing screen.
Figure 3:
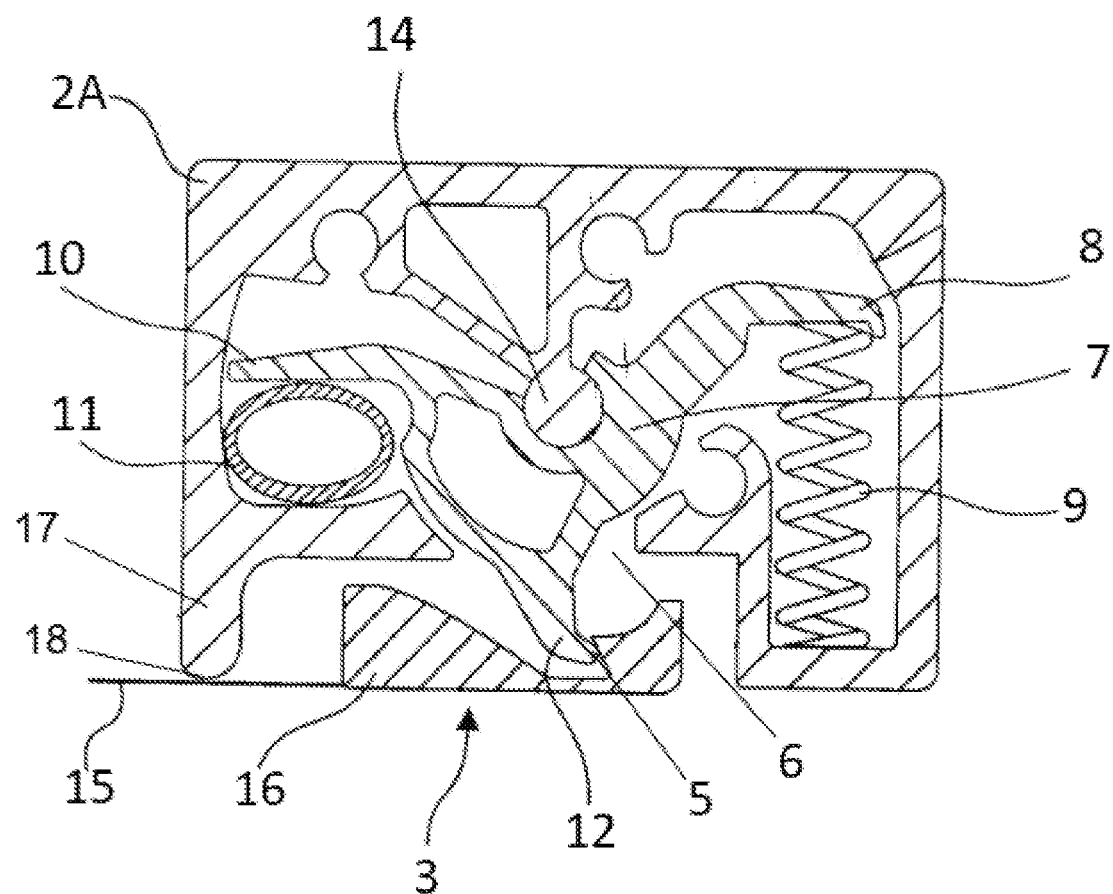
FIG. 3 schematically shows a cross-section of a beam of the tensioning frame of FIG. 1 in engagement with a printing screen.

In FIG. 4A, an autonomous intelligent vehicle (AIV) 20 approaches a printing machine 21. The AIV 20 has storage for carrying one or more tensioning frames, each of which may optionally be loaded with a printing screen such as shown in FIG. 2, which tensioning frames could comprise tensioning frames in accordance with the present invention and described in more detail below, or other types of tensioning frame, such as the known VectorGuard frames previously described with reference to FIGS. 1 and 3. In the specific example shown, the AIV 20 shown is loaded with a tensioning frame 22 in accordance with the present invention, which here is preloaded with a printing screen 23. Furthermore, the AIV 20 is provided with a printing screen storage magazine for storing at least one printing screen. As shown, AIV 20 carries four printing screens 24 which are not loaded into a tensioning frame. In addition, the AIV 20 also comprises a transfer mechanism shown generally at 88 for transferring a printing screen 24 from the printing screen storage magazine laterally into a tensioning frame. The transfer mechanism may for example comprise a movable arm or tray capable of laterally impelling a printing screen between its storage and the tensioning frame. The AIV 20 is operative to rearrange or shuffle tensioning frames and printing screens within its magazine, so that a selected tensioning frame or printing screen may be loaded to a printing machine or received therefrom. AIVs with such shuffling mechanisms for planar items are generally known in the art, and so the operation need not be described in great detail here.

In FIG. 4B, the AIV 20 aligns with the printing machine 21. In the position, the AIV 20 is able to load a tensioning frame or a printing screen to the printing machine 21, to be received within a printing volume 25 within the printing machine 21. As shown, a hatch 26 of the printing machine 21 is in an open position, to provide external access to the printing volume 25. It should be understood that other printing machines (not shown) may have other ways of providing such access.

Figure 4C:
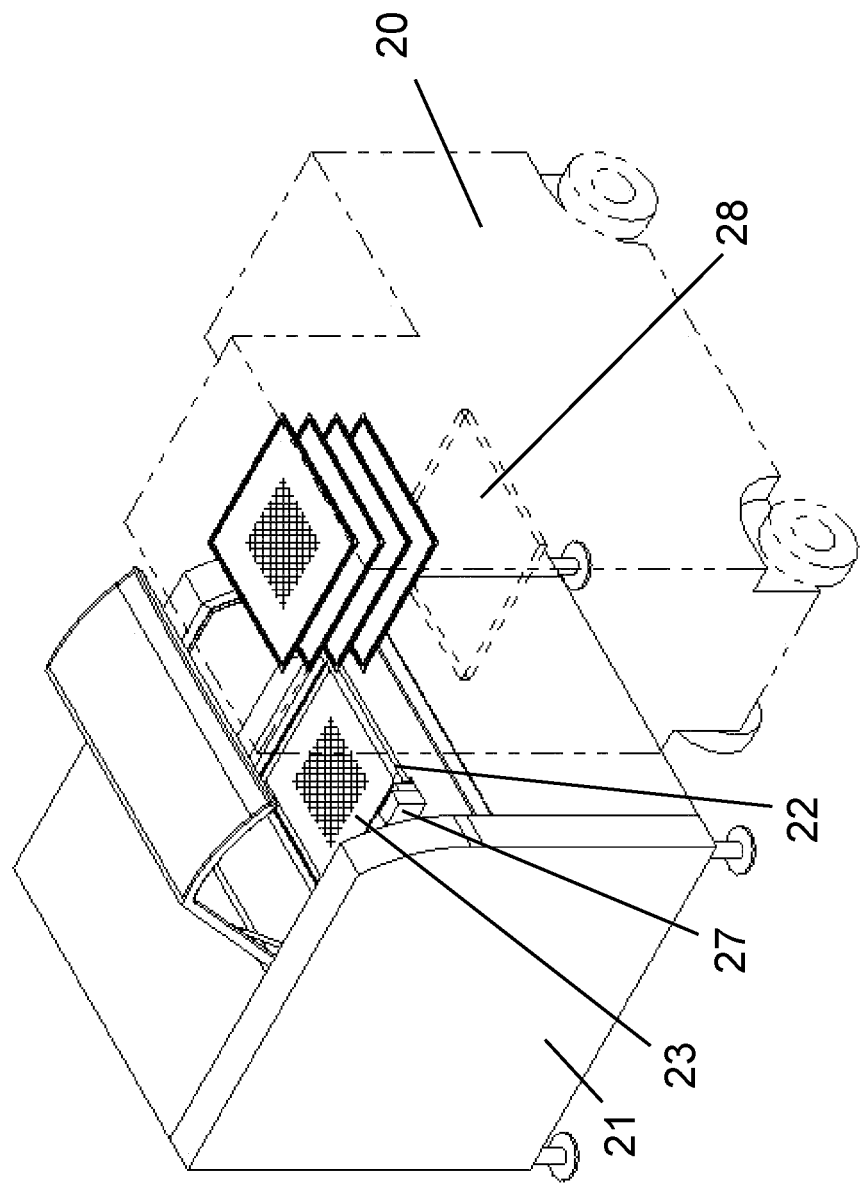

In FIG. 4C, the AIV 20 loads the tensioning frame 22, already containing (for the sake of example only) the printing screen 23 into the printing machine 21. The tensioning frame 22 is shown fully loaded within the printing machine 21, in which position it is supported by clamping rails 27. The AIV 20 now has an empty slot 28 in its magazine.

Figure 4D:
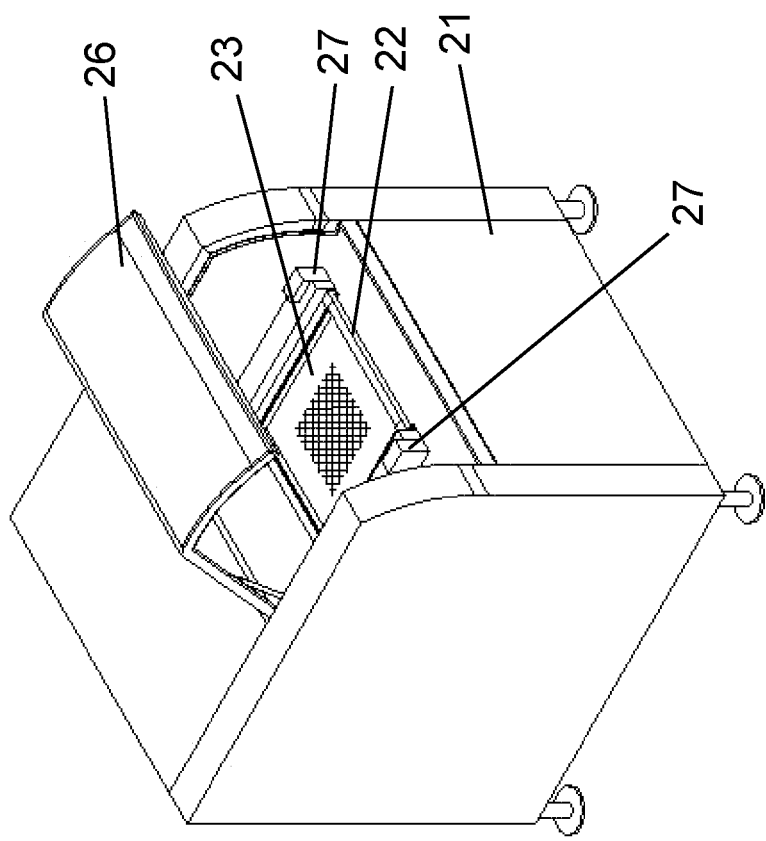
Figure 4E:
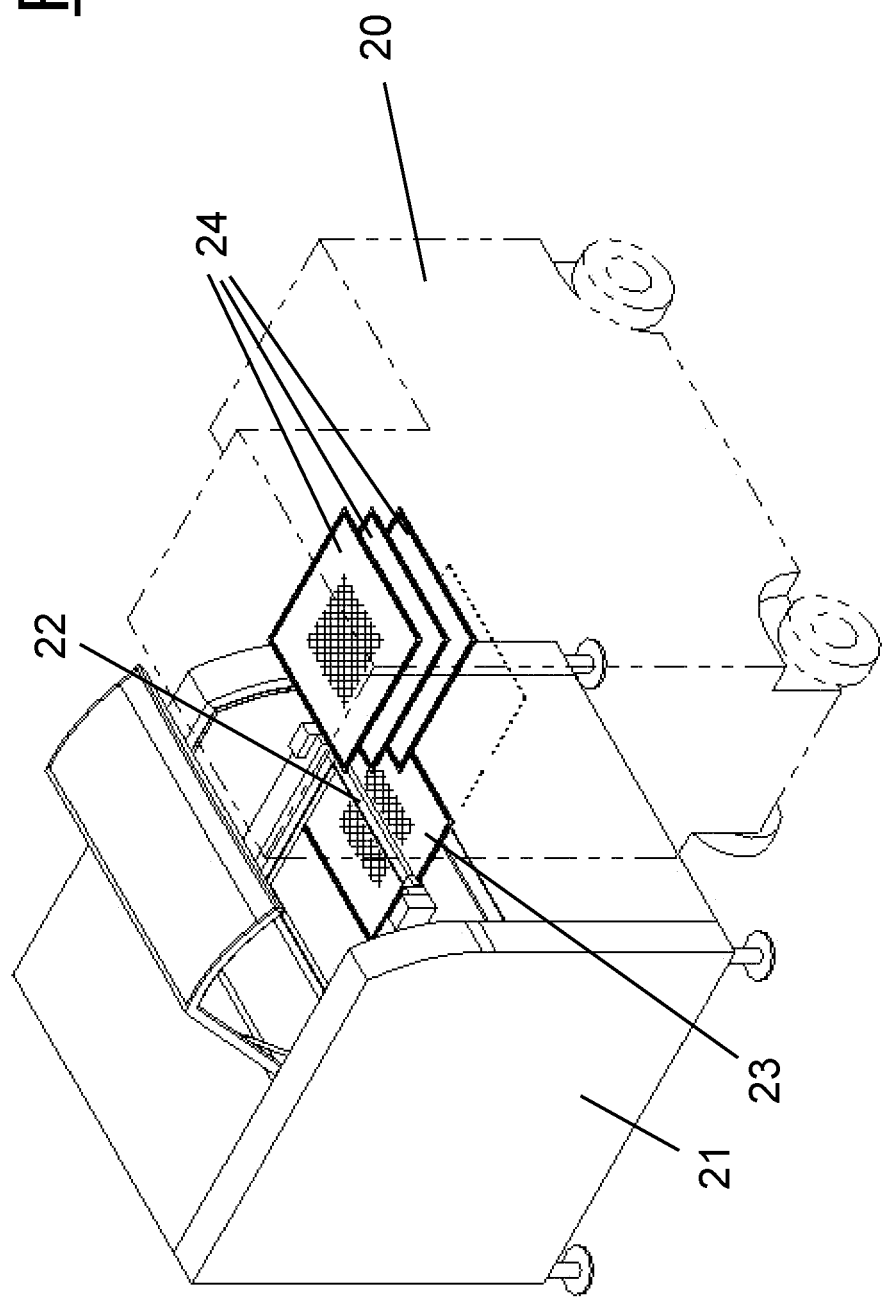

In FIG. 4D, the printing machine 21 is loaded and, following closure of the hatch 26, will be operational. A printing operation, in which a workpiece (not shown) is printed with print medium through a pattern of apertures provided in printing screen 23, may then commence.

Figure 4F:
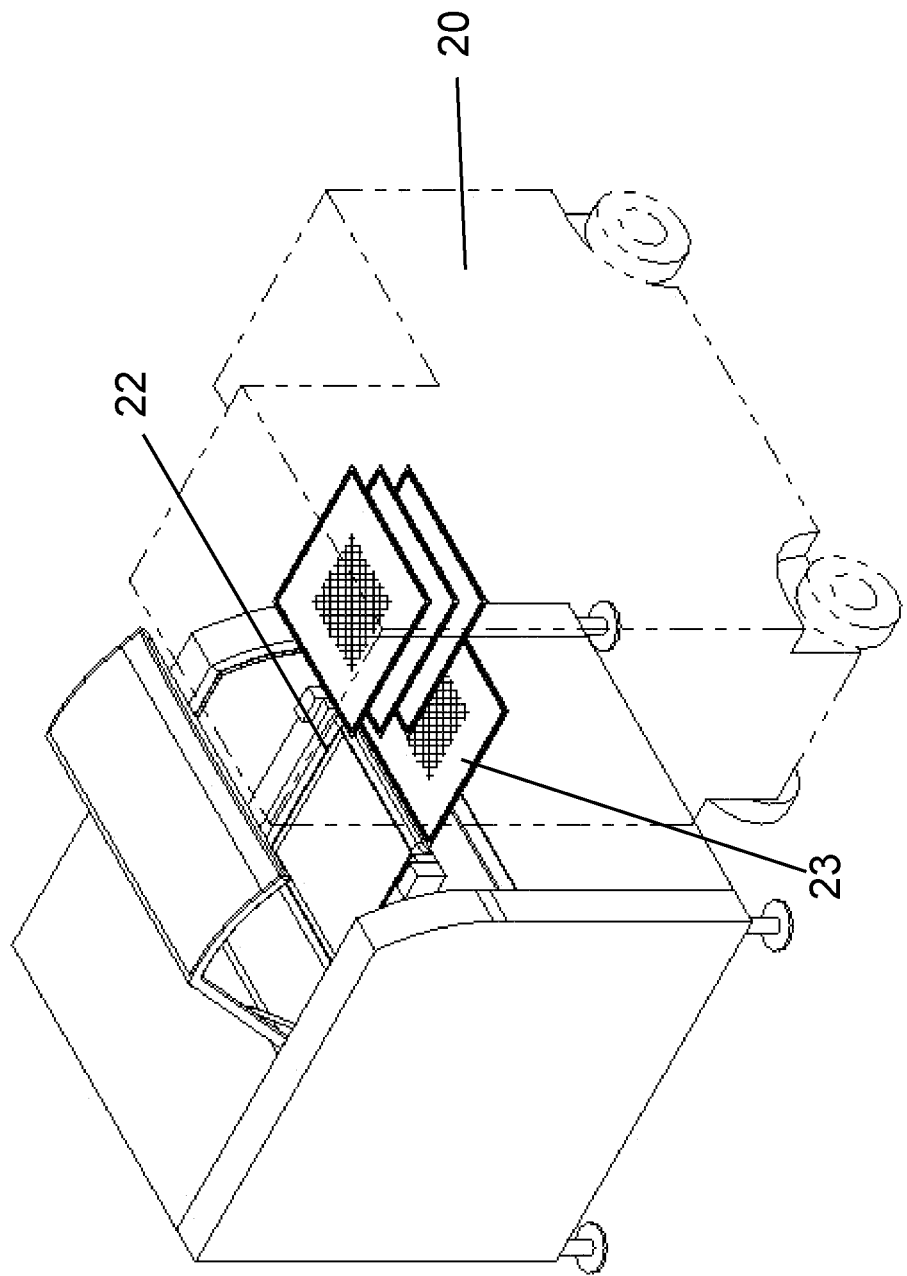
Figure 4G:
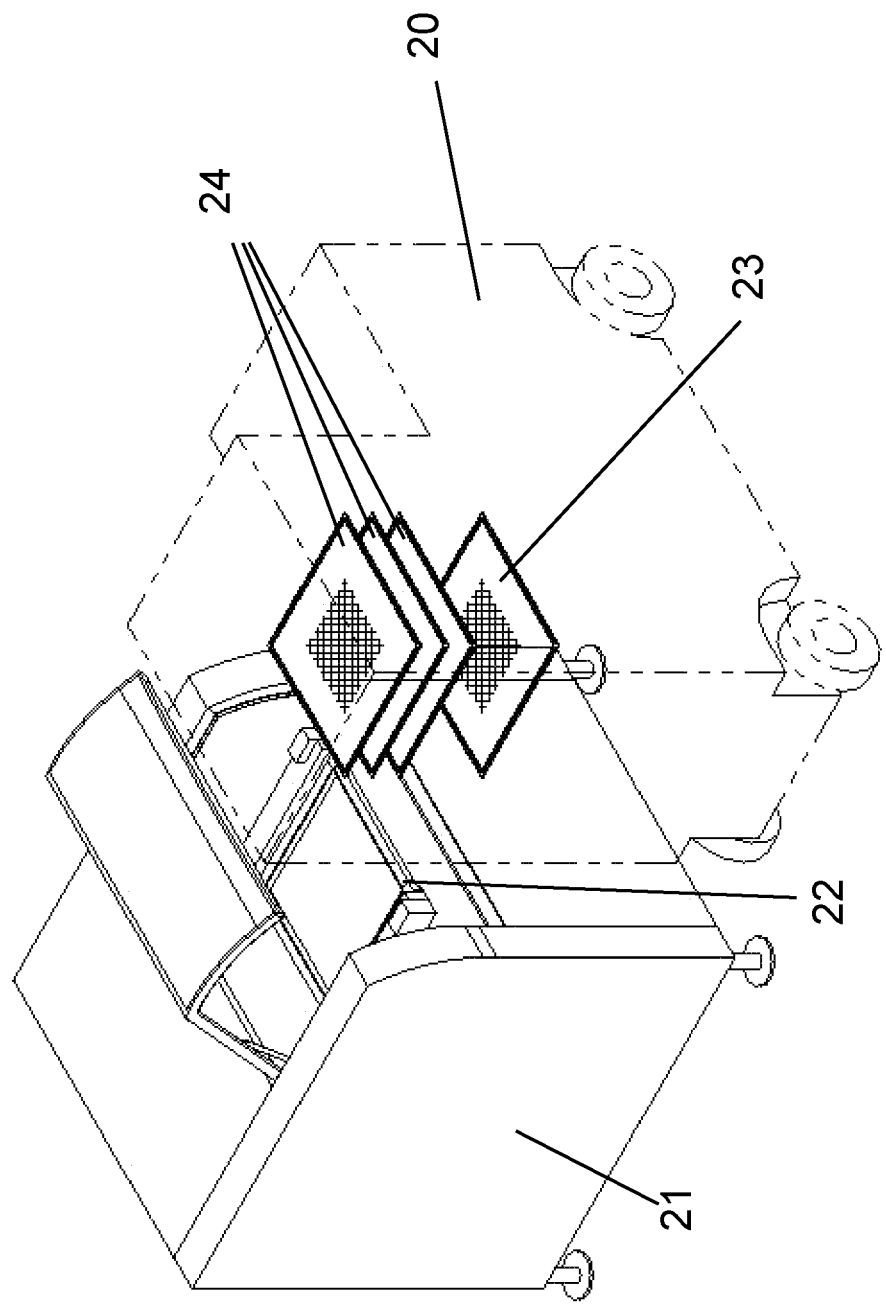

In FIGS. 4E-H, following completion of the printing operation, the AIV 20 unloads the printing screen 23 from the tensioning frame 22 to a magazine storage slot within the AIV 20. In more detail, in FIG. 4E, the AIV 20 is moved into alignment with the printing machine 21, and the AIV 20's magazine is shuffled so that an empty slot is provided at the vertical height of the printing screen 23 within the printing machine 21. In accordance with the present invention, the printing screen 23 is removed from the tensioning frame 22 through an opening (not explicitly shown) provided in a beam thereof, while the tensioning frame 22 remains clamped within the printing machine 21. In FIG. 4F, the printing screen 23 is shown nearly fully removed from the tensioning frame 22, while FIG. 4G shows the printing screen 23 received inside a slot of the AIV 20. As shown in FIG. 4H, the AIV 20's magazine is then shuffled to move a new printing screen 24A to the same vertical height as the tensioning frame 22 clamped within the printing machine 21.

In FIG. 4I, the AIV 20 loads the printing screen 24A into the tensioning frame 22, which is still clamped within the printing machine 21.

In FIG. 4J, the AIV 20 can move away, with the printing machine 21 and its tensioning frame 22 fully loaded and, following closure of the hatch 26, ready for a printing operation.

To enable this functionality, in one aspect the present invention provides a robot for loading a printing screen into a tensioning frame, comprising: a printing screen storage magazine for storing at least one printing screen, and a transfer mechanism for transferring a printing screen from the printing screen storage magazine laterally into a tensioning frame. Such a robot, such as for example the AIV 20 described above, may comprise a frame storage, for storing a tensioning frame, with the transfer mechanism being adapted to transfer the tensioning frame into a printing machine. Advantageously, the robot may comprise an autonomous intelligent vehicle as shown in FIGS. 4A-C and E-J. In other embodiments however, such a robot could for example comprise a dedicated robotic arm located proximate the printing machine with an in-built printing screen storage mechanism and optionally an in-built frame storage.

B. Exemplary Tensioning Frame Construction

Figure 5:
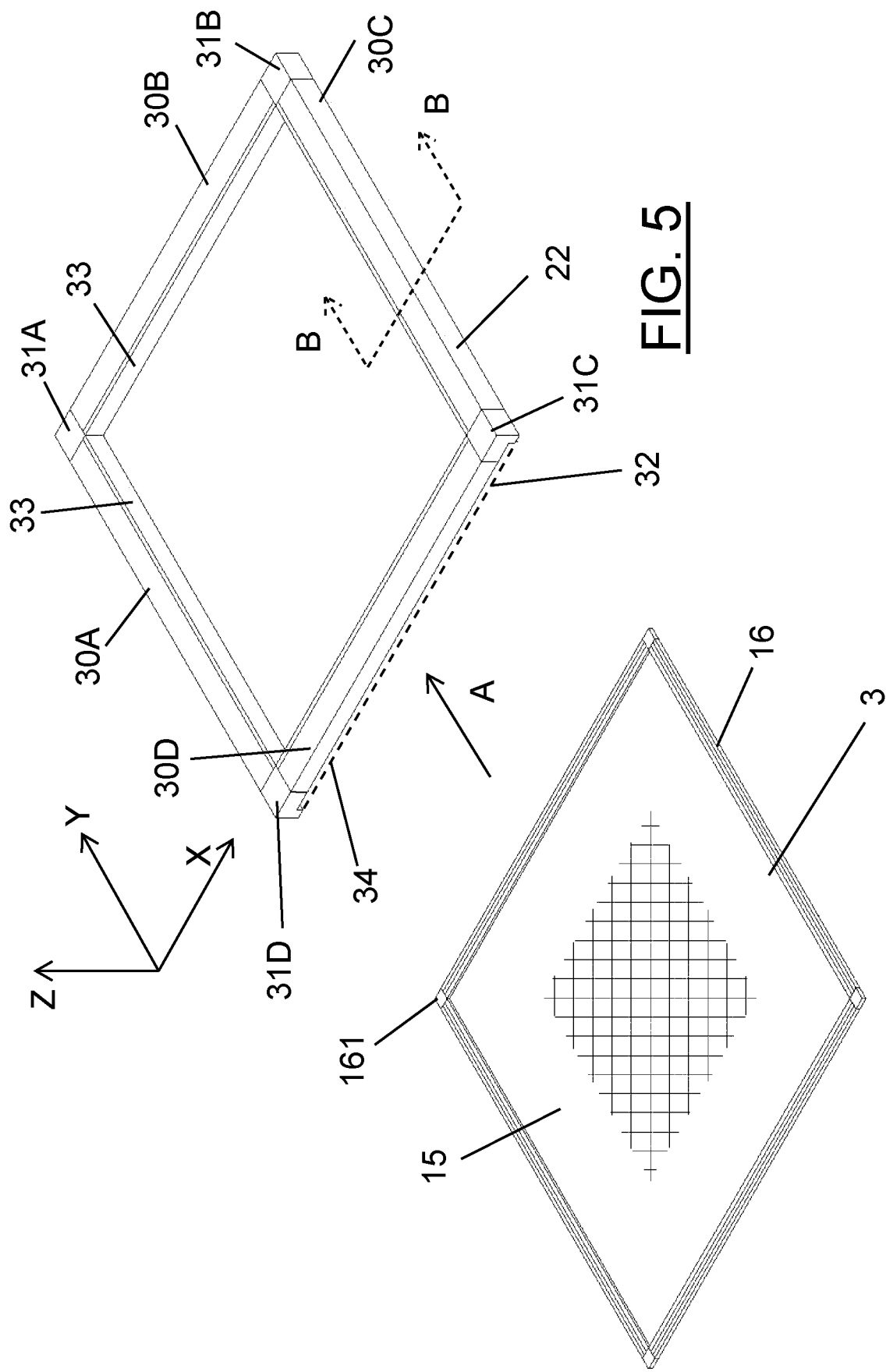
FIG. 5 schematically shows, in perspective view, a tensioning frame in accordance with an embodiment of the present invention from above.
Figure 6:
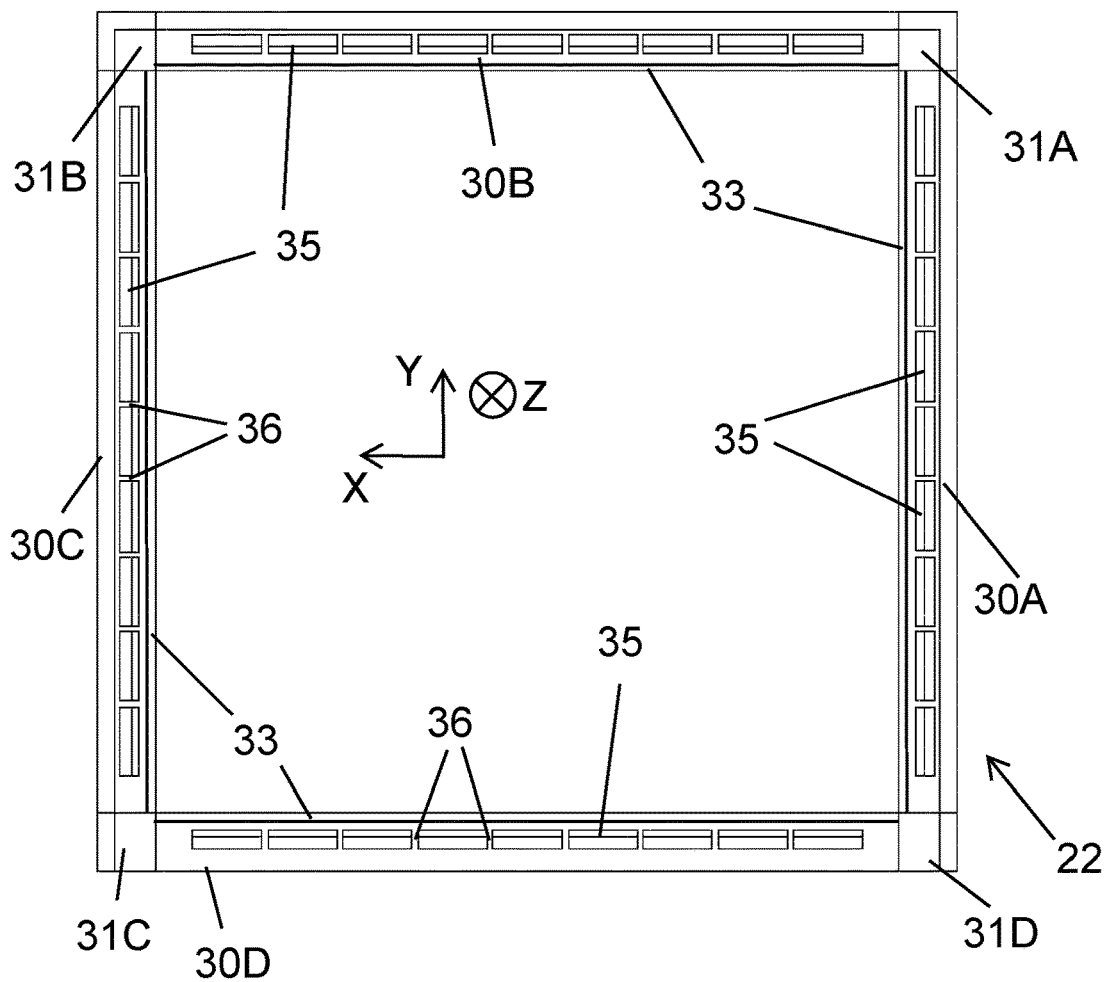
FIG. 6 schematically shows the underside of the tensioning frame of FIG. 5.

FIGS. 5 and 6 schematically show a tensioning frame 22 in an unloaded state, i.e. without accommodating a printing screen, in perspective from above, and also from below, as well as (in FIG. 5 only) a printing screen 3, which here is shown as a VectorGuard-compatible printing screen as previously-described, having a foil/mesh 15 attached at its periphery by edging 16, including edging corner pieces 161, as is well-known in the art. The tensioning frame 22 is sized to receive a printing screen 3 of a particular size, which sizes are generally standard in the art. Tensioning frame 22 is shown having rectangular form, defined by four elongate beams 30A-30D, each beam forming a side of the rectangle around the periphery of the tensioning frame 22. Adjacent beams are connected together, for example using screws, interference fits or other well-known alternatives, via corner blocks 31A-D. Throughout the detailed description, the use of the suffixes A-D when appended to reference numerals is taken to mean that the identified component is associated with a particular beam or corner block 30A-D, 31A-D. It can be seen that with this configuration, the tensioning frame 22 is substantially planar, extending in the X-Y plane as shown, which in use corresponds to the horizontal plane. At least one of the beams 30A-D, in this case beam 30D only, is provided with an opening 32 in a lateral side thereof, which is dimensioned to permit a printing screen 3 to be received therethrough, in a direction parallel to the plane of the tensioning frame 22 and as shown by arrow A. In the embodiment shown, the opening 32 is provided as an open-sided recess formed in beam 30D and the adjacent corner blocks 31C, 31D. However, in alternative embodiments, the opening 32 may be closed on all sides, so that it takes the form of a slot or "letterbox" within the respective beam and corner blocks, for example by providing an optional bar 34 extending between the undersides of the adjacent corner blocks, i.e. 31C and 31D as shown. Each beam 30A-D also includes a blade 33 arranged proximate the internal lateral sides of the respective beam, i.e. at that lateral side of the beam which faces an interior region of the tensioning frame 22 in which a central region of a printing screen 3 is located in use (see FIG. 8). As will be described in more detail below, each blade 33 is moveable relative to its respective beam 30A-D along a range of travel in a direction normal to the plane of the tensioning frame 22, i.e. along the vertical or Z-axis as shown. As can be seen from FIG. 6, each beams 30A-D also includes a plurality of engagement bodies 35, linearly arranged along the length of the respective beam. They are arranged in a spaced configuration, separated by bridges 36, as will be described in more detail below.

Figure 7:
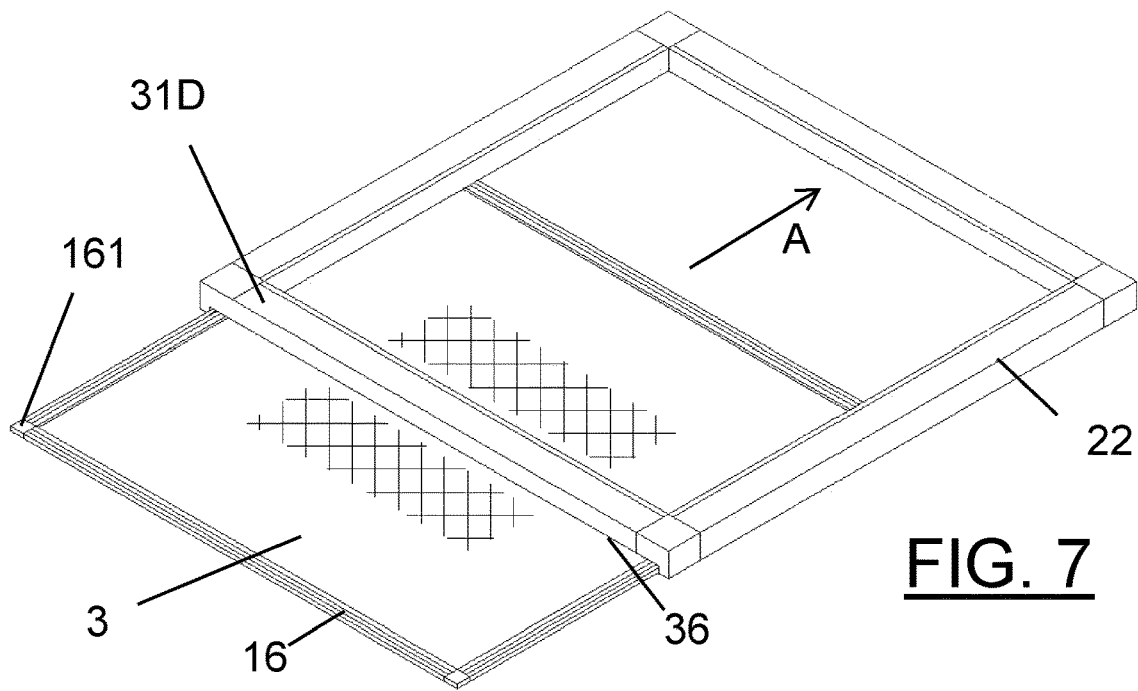
FIGS. 7 and 8 schematically show, in perspective view, the tensioning frame of FIG. 5 in part-loaded and loaded configurations.
Figure 8:
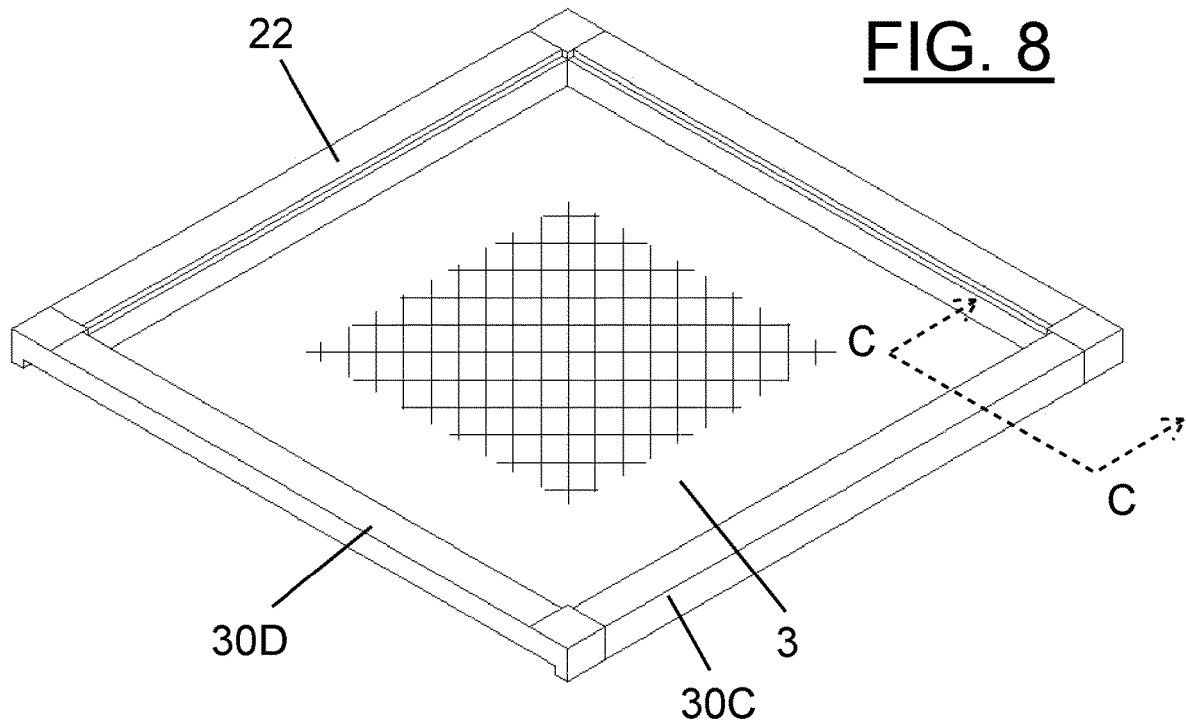

FIGS. 7 and 8 schematically show, in perspective view from above, the tensioning frame 22 of FIG. 5 in part-loaded and loaded configurations. FIG. 7 shows the printing screen 3 extending through the opening 36 during its loading in direction A, while FIG. 8 shows the printing screen 3 fully received within tensioning frame 22. It can be seen from this figure that the printing screen 3 does not project beyond the footprint of the tensioning frame 22 when loaded therein.

Figure 9:
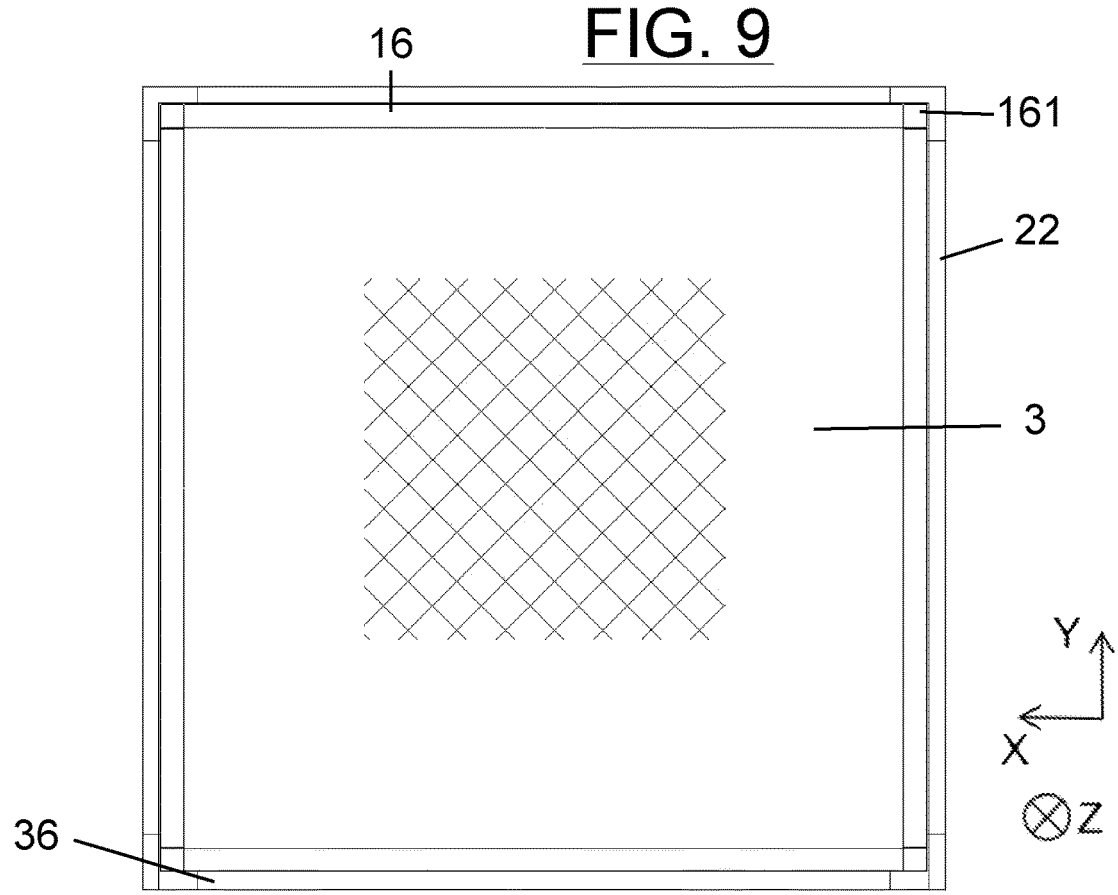
FIG. 9 schematically shows the underside of the loaded tensioning frame of FIG. 8.

FIG. 9 schematically shows the underside of the loaded tensioning frame of FIG. 8. The majority of the underside of the tensioning frame 22 is obscured by the underside of the printing screen 3.

Figure 10:
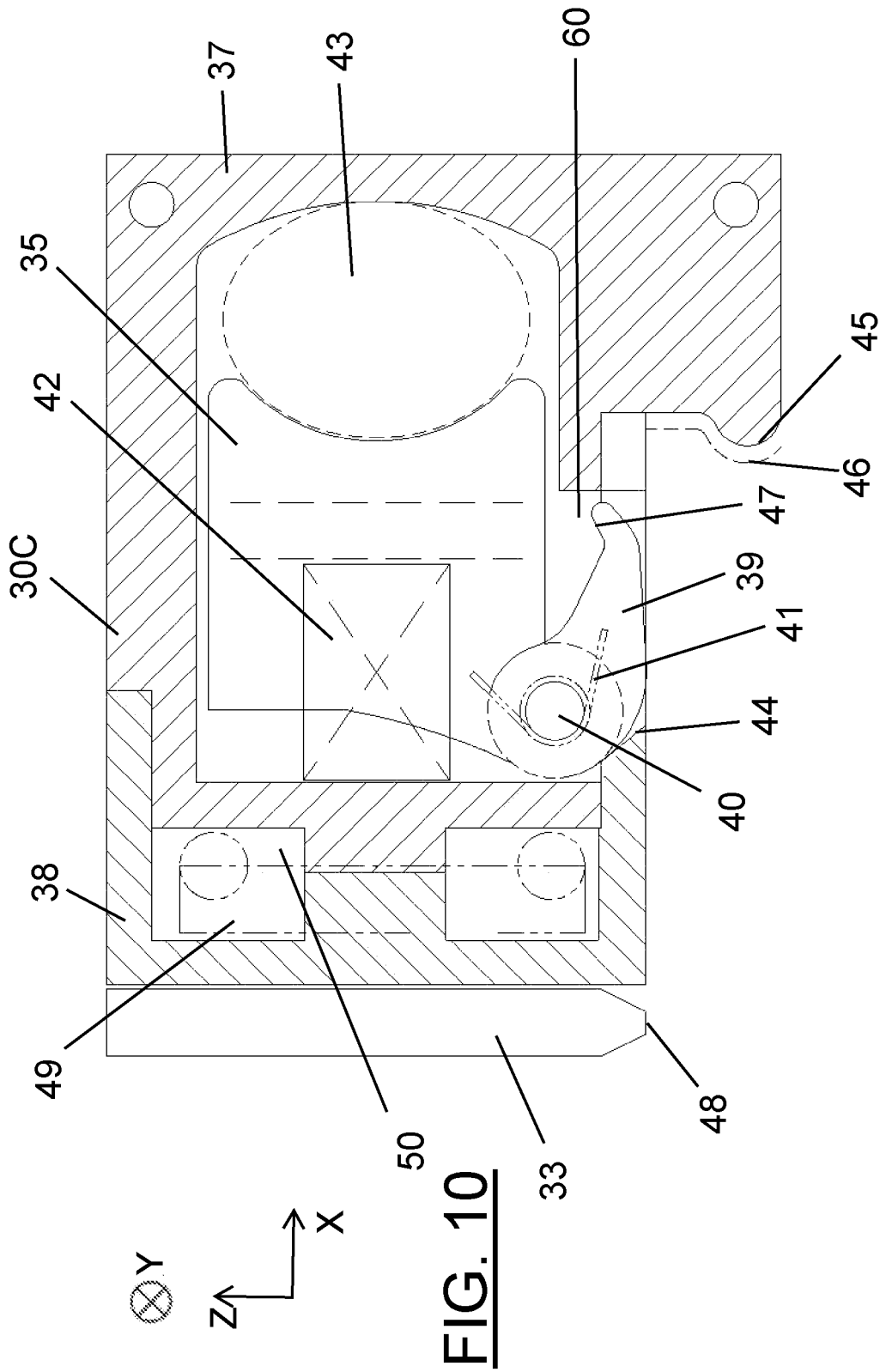
FIG. 10 schematically shows a sectional view of beam 30C taken along the line B-B of FIG. 5.

FIG. 10 schematically shows a sectional view of beam 30C taken along the line B-B of FIG. 5. Beam 30C, similarly to the other beams 30A, B, D, has a two-part construction including a main beam body 37 rigidly connected to a beam cover 38. Each of these parts may be formed from extruded metal, such as steel, aluminium or the like, and be connected together by screws, interference fit or similar. A void 50 is formed in the gap between the beam body 37 and beam cover 38, which houses a motion converting mechanism 49 for driving the blade 33, as will be described in more detail below. The beam body 37 is formed as a hollow channel which extends the length of the beam 30C, with an open side or aperture 60 at its base. The engagement body 35 is located within the channel, the channel and engagement body 35 being dimensioned so that the engagement body 35 is laterally movable relative to the beam 30C, i.e. along the horizontal X axis and along a range of travel in a plane normal to the length of the beam 30C, within the beam body 37, so that it acts like a shuttle or piston. An actuator, here in the form of a pneumatically-inflatable tubing 43, is operatively connected to the engagement body 35 at an end thereof adjacent to the lateral exterior side of the beam 30C. The tubing 43 extends the length of the beam 30C and is pneumatically connected to adjacent corner pieces 31B, 31C. In practice, the tubing 43 need not be fixedly connected to the engagement body 35, but may simply be located next to it so that it is in contact therewith throughout at least some of the engagement body 35's range of travel, as will be described in more detail below. The other end of the engagement body 35 is operatively to a biasing means, such as a compression spring 42, which biases the engagement body 35 laterally outwardly, i.e. towards the tubing 43 in the positive X direction shown. The compression spring 42 is also located within the channel of beam body 37. The engagement body 35 may be formed from a rigid material such as steel, aluminium, carbon fibre or rigid plastics for example. An engagement arm 39 is movably mounted to the engagement body 35 at a lower side thereof so that it is movable relative to the engagement body 35. In the embodiment shown, the engagement arm 39 is pivotably mounted to the engagement body 35 via a pivot 40, so that the engagement arm 39 may rotate relative to the engagement body 35 about a pivot axis parallel to the length of the beam 30C or the Y axis as shown. The engagement arm 39 is biased towards an extended position in which the engagement arm 39 projects downwards through the channel opening by a biasing means, which in the embodiment shown comprises a torsion spring 41. The position of the engagement arm 39 relative to the engagement body 35 is controlled using a profiled edge 44 of the beam 30C, here provided at a lower side of the beam cover 38, and in the form of an inclined surface. If the engagement body 35 is driven towards the beam cover 37, i.e. in the negative X direction shown, the engagement arm 39 contacts the profiled edge 44 and is rotated clockwise into a retracted position as shown. The engagement arm 39 carries an engagement surface 47 for engaging with a printing screen in use, as will be described in more detail below. As shown in FIG. 10, the tubing 43 is fully inflated, so that the engagement body 35 is driven in the negative X direction to its maximum extent. The engagement arm 39 is moved fully into its retracted position through the contact with profiled edge 44, against the bias of torsion spring 41, and in this retracted position the engagement arm 39 does not protrude through aperture 60 to project below the channel or the beam cover 38. In this retracted position, a printing screen may be inserted into the tensioning frame 22 without risk of collision between the printing screen and the engagement arm 39. The lower side of beam 30C includes a profiled section 45, in this case formed as a projection extended outwardly in the negative X direction as shown. A conformal surface, in this embodiment comprising a leaf spring 46, is also provided proximate this profiled section 45, extending downwardly from the beam body 37. The profiled section 45 and leaf spring 46 act in use to contact the edging of a printing screen, helping to support the printing screen and ensure its centring within the tensioning frame 22, as is described in more detail below.

In alternative embodiments (not shown), the engagement arm 39 may instead be translationally movable relative to the engagement body 35, for example slidable relative thereto, for example loosely retained within a slot provided in the engagement body 35. In that case, the engagement arm 39 may be biased towards the extended position in which the engagement arm 39 projects downwards through the channel aperture 60 by an alternative biasing means, such as a compression spring. In such an embodiment, the profiled edge 44 may act as a cam to raise the engagement arm 39 upwardly relative to the engagement body 35 and into the retracted position, such cam mechanisms being well understood per se.

It should be noted that the beams 30A, 30B are of identical construction to beam 30C illustrated. Beam 30D however, which includes the opening 36, is of slightly different construction, and a corresponding sectional view is schematically shown in FIG. 11. Here it can be seen that the beam 30D is narrower, with beam body 37 having a lower surface at the same level as the base of the channel, and unlike beams 30A-C there is neither a profiled section 45 nor a leaf spring 46. With this construction there is no obstruction to a printing screen inserted through the opening 36 in direction A (the positive Y direction as shown).

FIG. 12 schematically shows a sectional view of beam 30C taken along the line C-C of FIG. 5. This section coincides with the position of a bridge 36 located between intermediate two adjacent engagement bodies 35. The bridge 36 itself is a projection of beam cover 38. A plate 51 is inserted into the channel, the plate being planar and extending parallel to the X-Z plane, normal to the length of the beam 30C. This sits between adjacent engagement bodies 35 and may act as a bearing therebetween. The bridge 36 and plate 51 provide additional structural rigidity to the beam 30C, and in particular help to prevent deformation of the channel or torsional deformation of the beam 30C. The plate 51 includes a recess 52 which accommodates the tubing 43. It should be noted that the use of such reinforcement bridging is further described in International Patent Application No. PCT/IB2020/057581.

Figure 13:
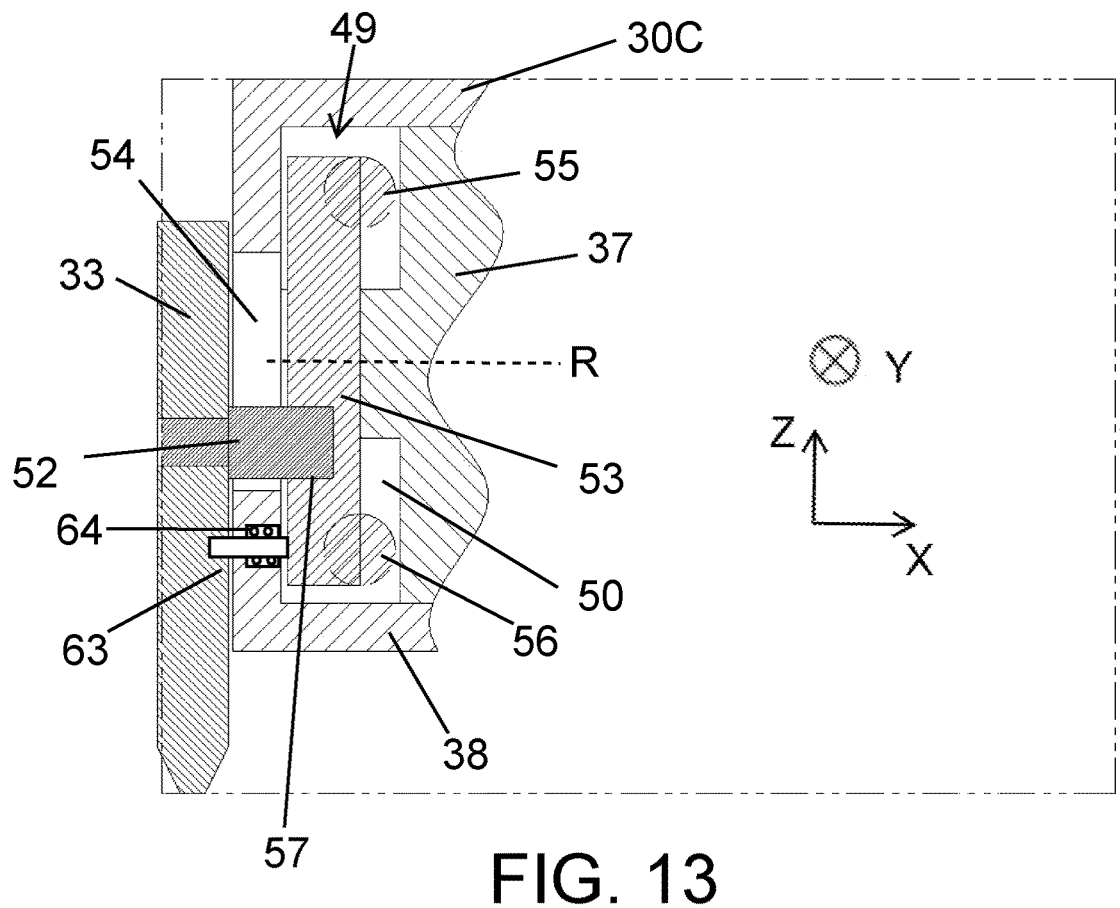
FIG. 13 schematically shows a sectional view of part of beam 30C.
Figure 14:
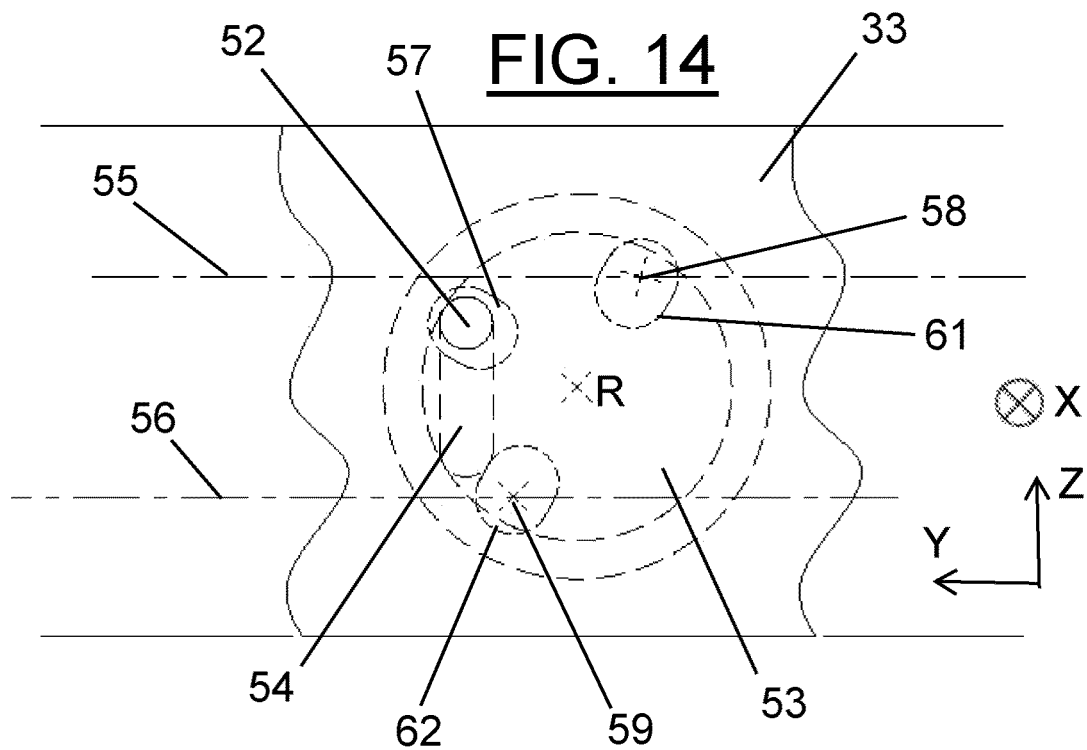
FIGS. 14 to 16 schematically show a side view of beam 30C during a blade lowering movement.
Figure 15:
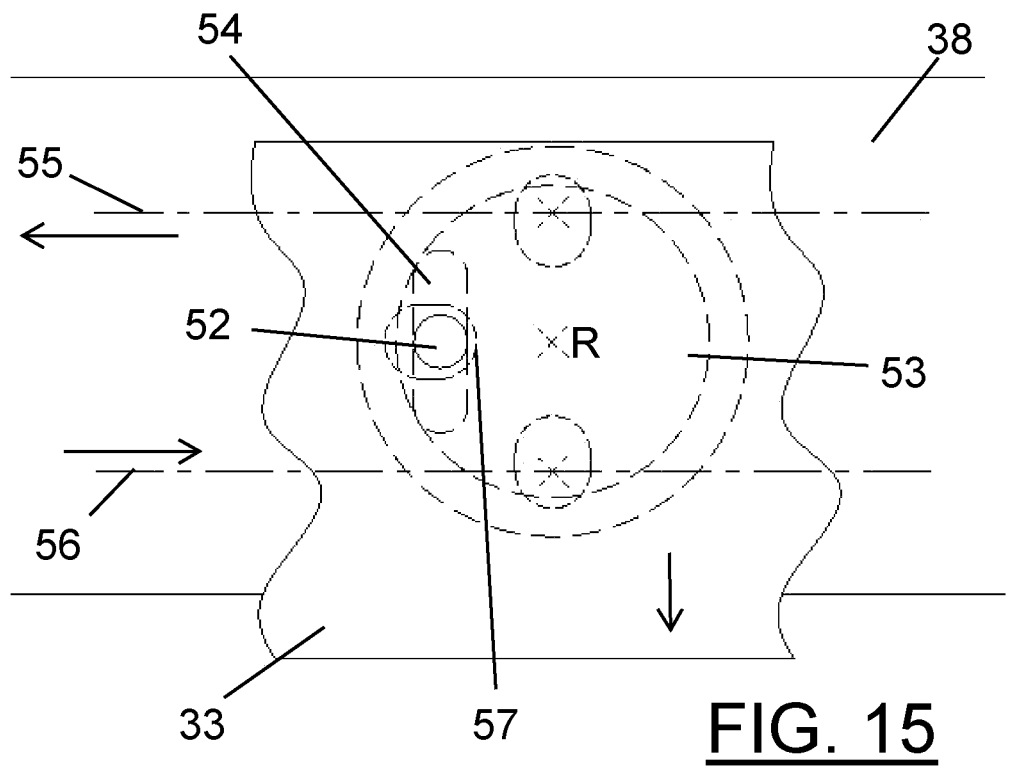
Figure 16:
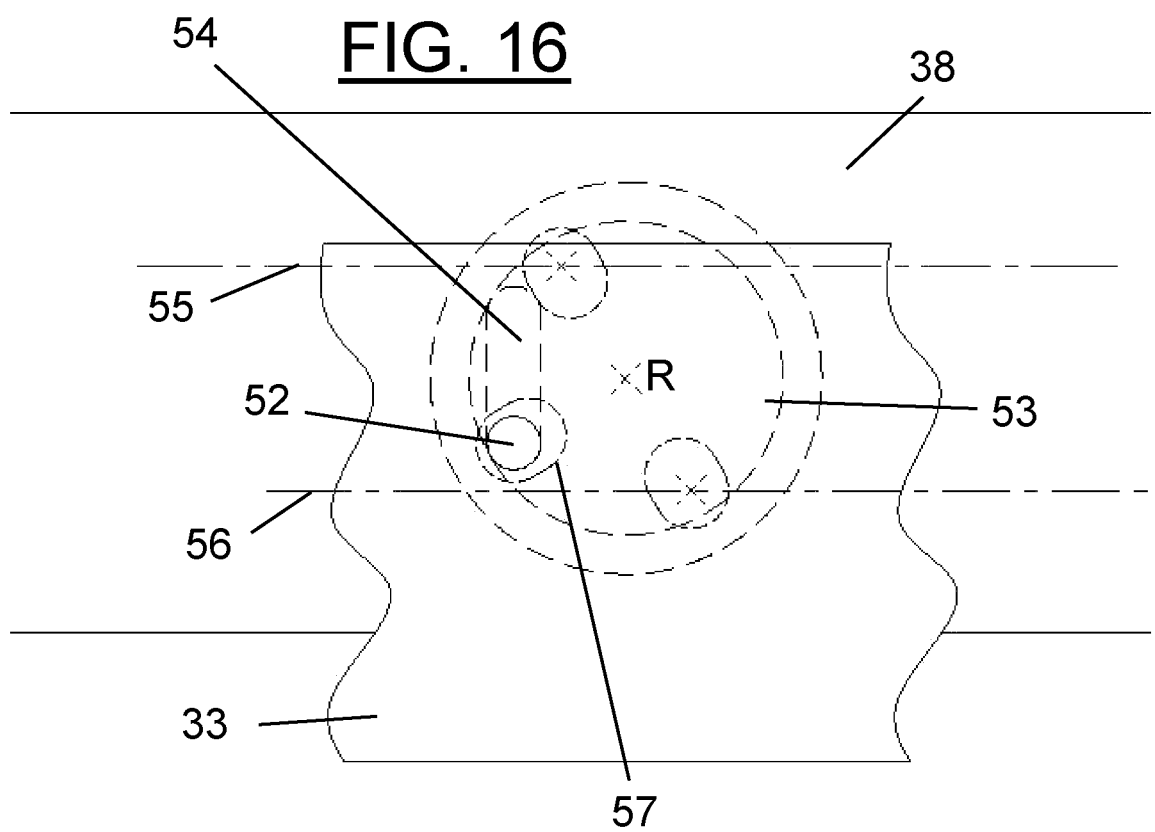

The operation of blade 33 will now be described with reference to FIGS. 13 to 16, of which FIG. 13 schematically shows a sectional view of part of beam 30C, and FIGS. 14 to 16 schematically show sequential side views of beam 30C during a blade lowering movement. Looking firstly at FIG. 13, for clarity much of the beam 30C is hidden, and only details of the blade 33 and its associated motion converting mechanism 49 are shown. The term "motion converting" relates to the fact the mechanism operates to convert motion in a first direction to motion in a different direction. In fact, the motion converting mechanism 49 described here converts linear motion along the length of the beam 30C to rotary motion, and then converts this rotary motion to linear motion of the blade 33 in the vertical or Z-axis direction. Blade 33 is here shown in an operational position, in which it is fully lowered relative to beam 30C so that it contacts the upper surface of a foil/mesh 15 of a printing screen 3. The blade 33 is connected by a drive pin 52 to a rotor 53 located within void 50. The drive pin 52 extends through a vertical slot 54 formed in the beam cover 38, forming a slotted link mechanism as will be described in more detail below. The rotor 53 shown is in the form of a planar disc, extending in a plane parallel to the blade 33, i.e. the Y-Z plane as shown, and is mounted to beam body 37 for rotation about a rotary axis R which extends parallel to the X axis as shown. The rotor 53 is rotated in use by first and second actuating members 55, 56 which engage with opposite edges of the rotor 53. Each of the first and second actuating members 55, 56 comprise drive rods which are linearly drivable along the length of beam 30C, i.e. parallel to the Y-axis as shown, and are pivotably connected to the rotor 53. In more detail, the first actuating member 55 is pneumatically drivable along the length of beam 30C, while the second actuating member 56 is mechanically linked to the first actuating member 55, for example via a parallelogram linkage (not shown). In this way, the first and second actuating members may be driven in opposite directions, which in turn will cause the rotor 53 to rotate about rotary axis R. The drive pin 52 is fixedly connected to the blade 33, for example via screw thread, but loosely retained within an oval bore 57 formed in the rotor 53 (more clearly visible in FIG. 14). Also shown in FIG. 13 is a locking mechanism, in this case a locking pin 63 mounted between the beam cover 38 and blade 33, which is operative to lock the blade 33 into the operational position shown. As shown, the locking pin 63 passes through an opening in beam cover 38 and contacts the rotor 53. By profiling the side of the rotor to create a camming surface, the locking pin 63 may then be moved parallel to the X axis as shown into locking engagement with the blade 33 when the rotor 53 is at a predetermined rotation. A locking spring 64, here a compression spring, is provided to bias the locking pin 63 to the right, i.e. in the positive X direction as shown, will ensure that the locking pin moves out of engagement with the blade 33 when the rotation direction of the rotor 53 is reversed. In practice, more than one locking mechanism may be required along the length of each beam 30A-D, depending, for example, on the size of the tensioning frame 22.

In FIGS. 14 to 16, the blade 33 is shown partly transparent, so that the positions of the rotor 53 and first and second actuating members 55 and 56 are visible. FIG. 14 shows the blade 33 in its withdrawn position in which the blade is at its vertically highest position so that it is spaced from the printing screen in use. In this position, the drive pin 52 is located at the top of slot 54. First actuating member 55, which is connected to rotor 53 via a pivot pin 58 located within an oval actuator bore 61 of the rotor 53, is relatively far to the right, while the second actuating member 56, which is connected to rotor 53 via a pivot pin 59 located within an oval actuator bore 62 of the rotor 53, is relatively far to the left as shown.

FIG. 15 shows an intermediate stage in the downward travel of the blade 33. The first actuating member 55, has been driven to the left, while the second actuating member 56, has been driven to the right, causing rotor 53 to rotate anticlockwise as shown. The drive pin 52 and hence blade 33 is thus moved down relative to the slot 54.

FIG. 16 shows a final stage in the downward travel of the blade 33, in which it reaches its operational position. The first actuating member 55, has been driven fully to the left, while the second actuating member 56, has been driven fully to the right, causing rotor 53 to rotate further anticlockwise as shown. The drive pin 52 is thus moved down to the bottom of the slot 54, and the blade 33 correspondingly moved to its lowest extent. Although not shown in FIG. 16, in this position the locking pin 63 is engaged, so that the blade 33 cannot be raised by applying upward force to the blade 33, but only be reversing the rotation of the rotor 53, by driving the first and second actuating members 55, 56 in the opposite directions, i.e. left and right respectively.

As described above, both the tubing 43 and the first and second actuating members 55, 56 are pneumatically operated. To effect this, it is necessary to provide pneumatic ports at the tensioning frame 22 and associated pneumatic pathways through it.

Figure 17:
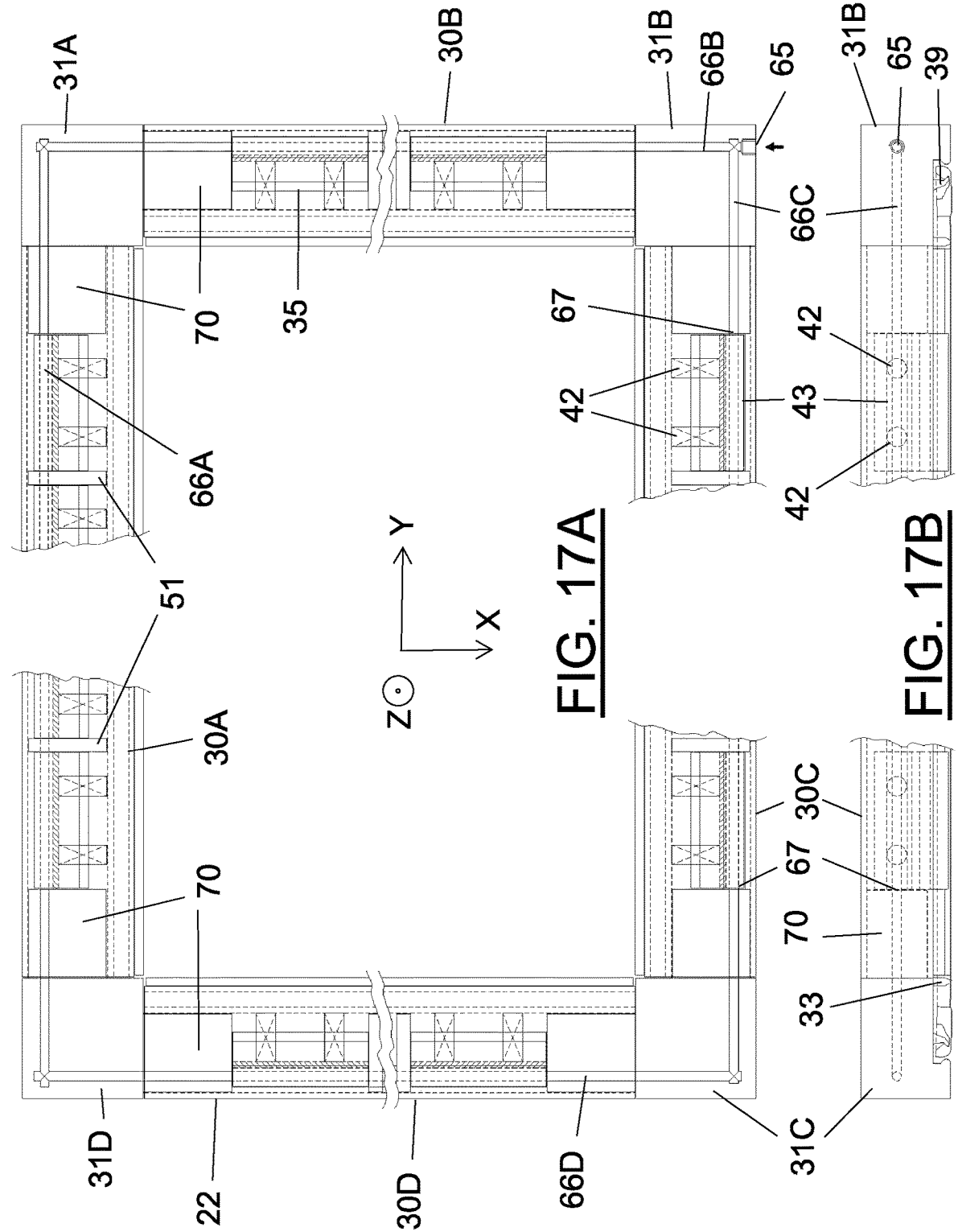
FIGS. 17A and 17B schematically show sectional plan view (from above) and a side view of the tensioning frame.

FIGS. 17A and 17B schematically show the pneumatic pathway arrangement for operating the tubing 43. In more detail, FIGS. 17A and 17B respectively schematically show a sectional plan view and a side view of the tensioning frame 22, with features unrelated to this arrangement being omitted for clarity. The corner blocks 31A-D include male projections 70 which are received within respective adjacent beams 30A-D. A first pneumatic port 65 is provided on corner block 31B for connection to an external pneumatic source (not shown). This is directly connected to pneumatic lines 66B, 66C which lead to beams 30B and 30C respectively, which in turn connect to pneumatic lines 66A, 66D which lead to beams 30A and 30D respectively. These pneumatic lines 66A-D connect to form a closed ring extending through all beams 30A-D and corner blocks 31A-D of the tensioning frame 22. The pneumatic lines 66A-D connect to tubing 43 at connections 67. Therefore, when pneumatic pressure is applied via first pneumatic port 65, the tubing 43 of each beam is expanded in concert. When the pneumatic supply is switched off, each tubing 43 is deflated through the action of the respective compression spring 42.

Figure 18:
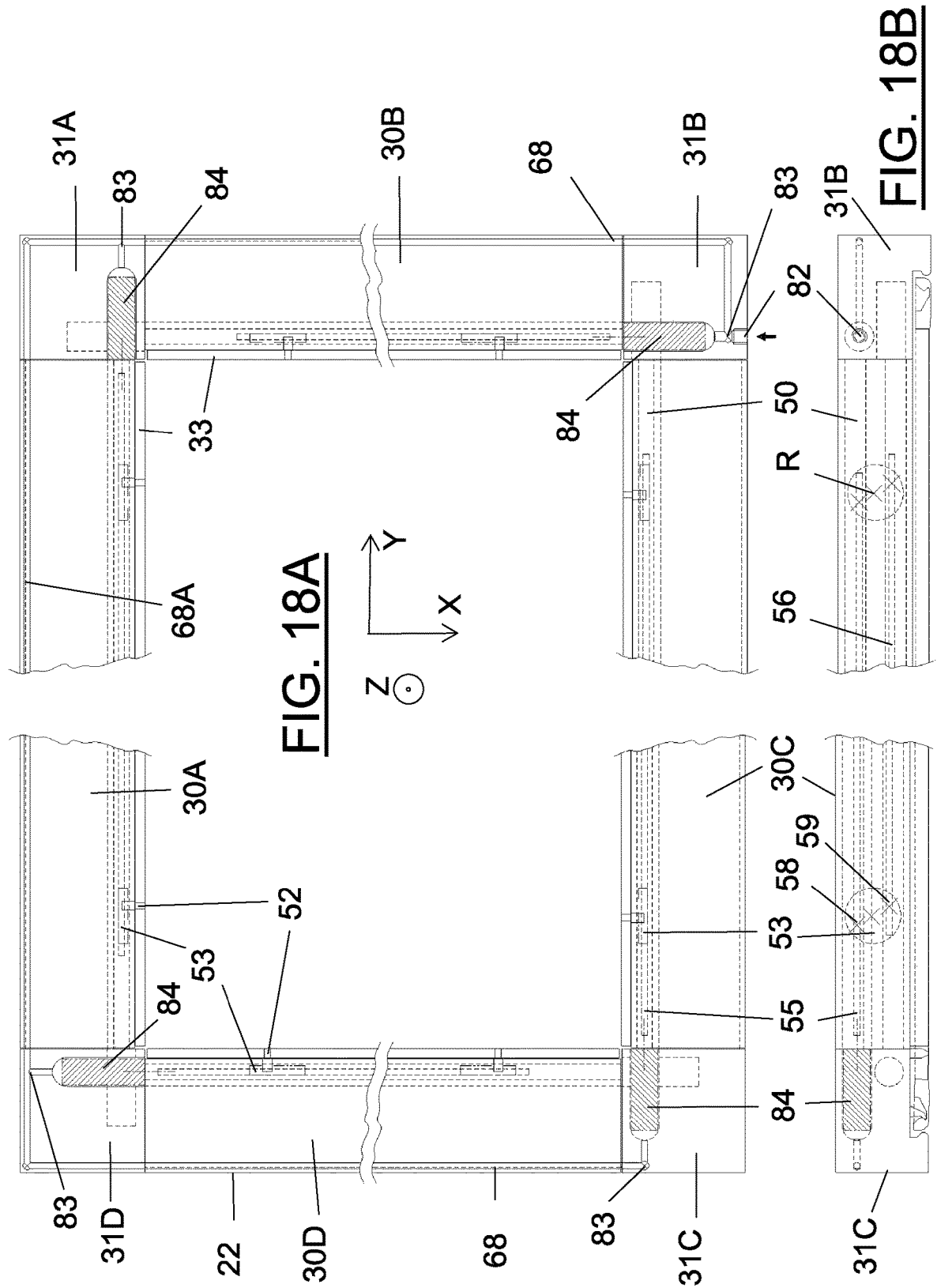
FIGS. 18A and 18B schematically show sectional plan view (from above) and a side view of the tensioning frame.

FIGS. 18A and 18B schematically show the pneumatic pathway arrangement for operating the blades 33. In more detail, FIGS. 18A and 18B respectively schematically show a sectional plan view and a side view of the tensioning frame 22, with features unrelated to this arrangement being omitted for clarity. A second pneumatic port 82 is provided on corner block 31B for connection to the external pneumatic source (not shown). This is directly connected to a pneumatic line 68 which extends around the majority of the tensioning frame 22, i.e. through beams 30B, 30A and 30D, via the intermediate corner blocks 31B, 31A, 31D. Each of the corner blocks 31A-D includes a junction 83 which pneumatically connects the pneumatic line 68 to a respective piston 84, which is linearly movable parallel to the length of an adjacent beam 30A-D. Each piston 84 provides mechanical actuation to a respective first actuating member 55, to reversibly drive the respective first actuating member 55 along the length of its respective beam 30A-D within void 50. When pneumatic pressure is applied via second pneumatic port 82, each piston 84 of each beam is driven in concert. Similarly, when negative pressure or a vacuum is applied via second pneumatic port 82, each piston 84 of each beam is driven back in the opposite direction in concert. If the pneumatic supply to second pneumatic port 82 is switched off at any time, then the first and second actuating members 55, 56 will remain in their current position, and if that current position is one in which the blade 33 is lowered into its operational position, this will be aided by the locking mechanism. In this way the tensioning frame 22 may be retained in a loaded state with the blade 33 lowered into its operational position without the application of pneumatic pressure.

In alternative embodiments (not shown), the pneumatic line 68 may form a closed ring around the entirety of the tensioning frame 22, i.e. extending through all of beams 30A-D via the respective intermediate corner blocks 31A-D. Alternatively or additionally, both the first and second actuating members may be pneumatically driven, for example by providing an additional piston at each corner block for driving the second actuating members, and associated pneumatic lines to drive them.

Figure 19:
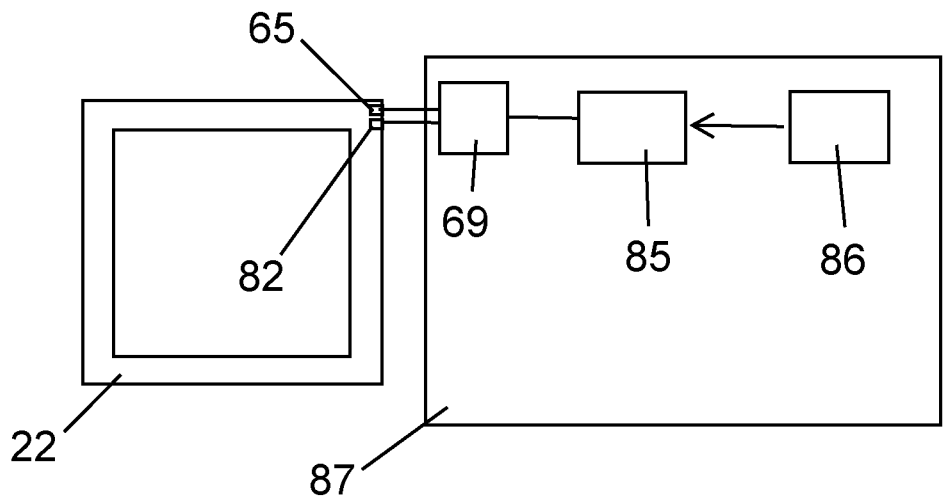
FIG. 19 schematically shows a pneumatic control arrangement.

FIG. 19 schematically shows an exemplary pneumatic control arrangement for the tensioning frame 22. As shown, the first and second pneumatic ports 65, 82 are pneumatically fed in use by a pneumatic source 85 via a pneumatic logic network 69. The pneumatic logic network 69 is used to control pneumatic flow through each of the pneumatic lines and paths 66A-D, 68. Using pneumatic logic enables sequencing of the two pneumatic flows to operate the tensioning frame 22 during the printing screen loading and unloading sequences, described below. In addition, operation of the pneumatic source 85 may advantageously be controlled by a control means 86, such as a computer, processor or the like. Advantageously, the pneumatic logic network 69, pneumatic source 85 and control means 86 may all be provided within a printing machine, shown generally at 87, to enable in-situ operation. In this case, the control means 86 may also control some or all of the printing operation of the printing machine 87. Dedicated pneumatic lines for connecting with each of the first and second pneumatic ports 65, 82 may be provided within the printing machine 87, arranged to align with the tensioning frame 22 when loaded into a printing location within the printing machine 87. If the loading operation is performed externally to a printing machine, then a pneumatic logic network and or pneumatic source may be connected and operated directly by an operator for example.

In alternative embodiments, at least part of a pneumatic logic network may be provided internally to the tensioning frame 22.

C. Exemplary Loading Sequence

Figure 20:
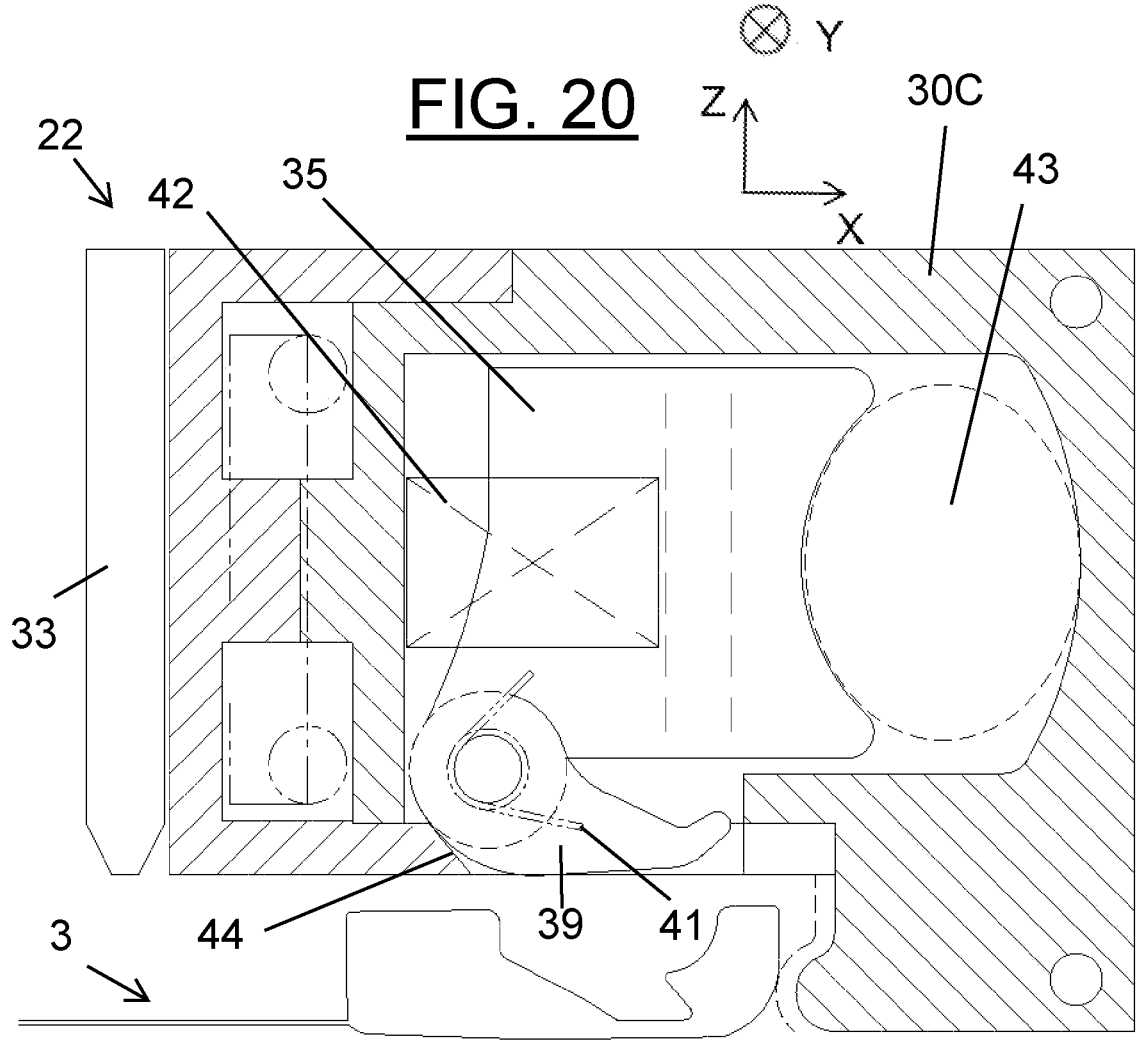
Figure 21:
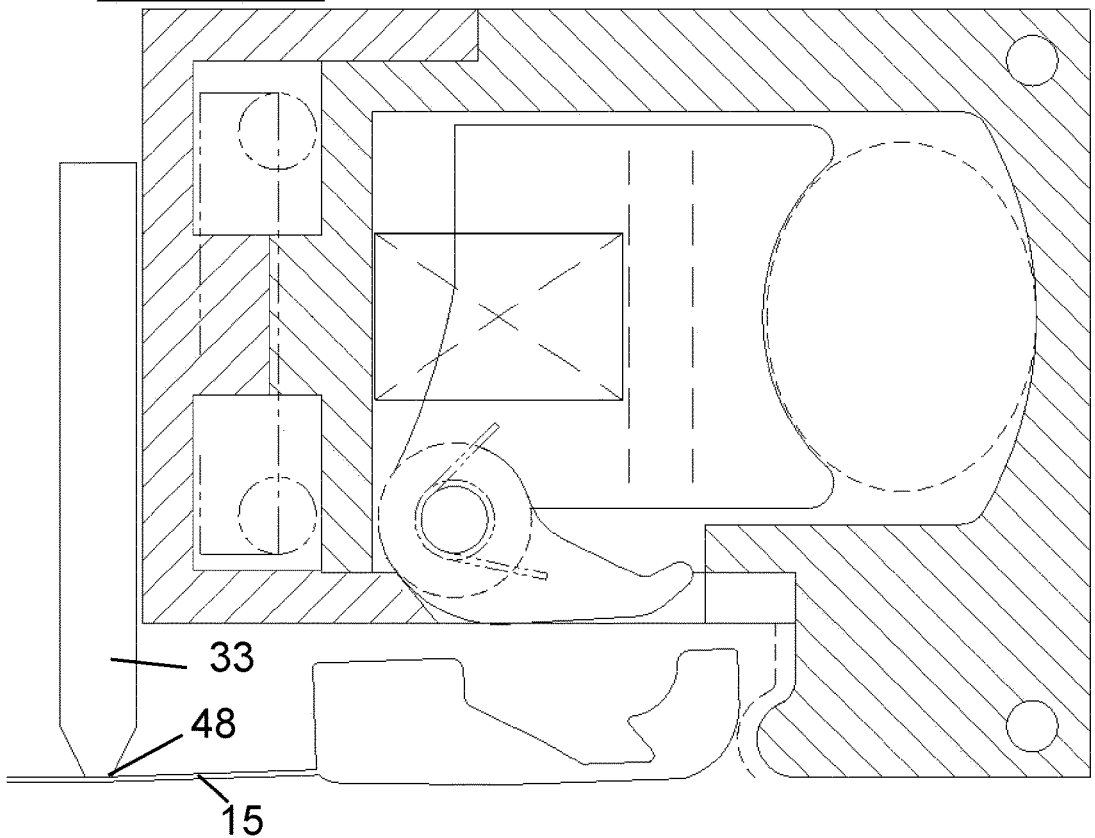
Figure 22:
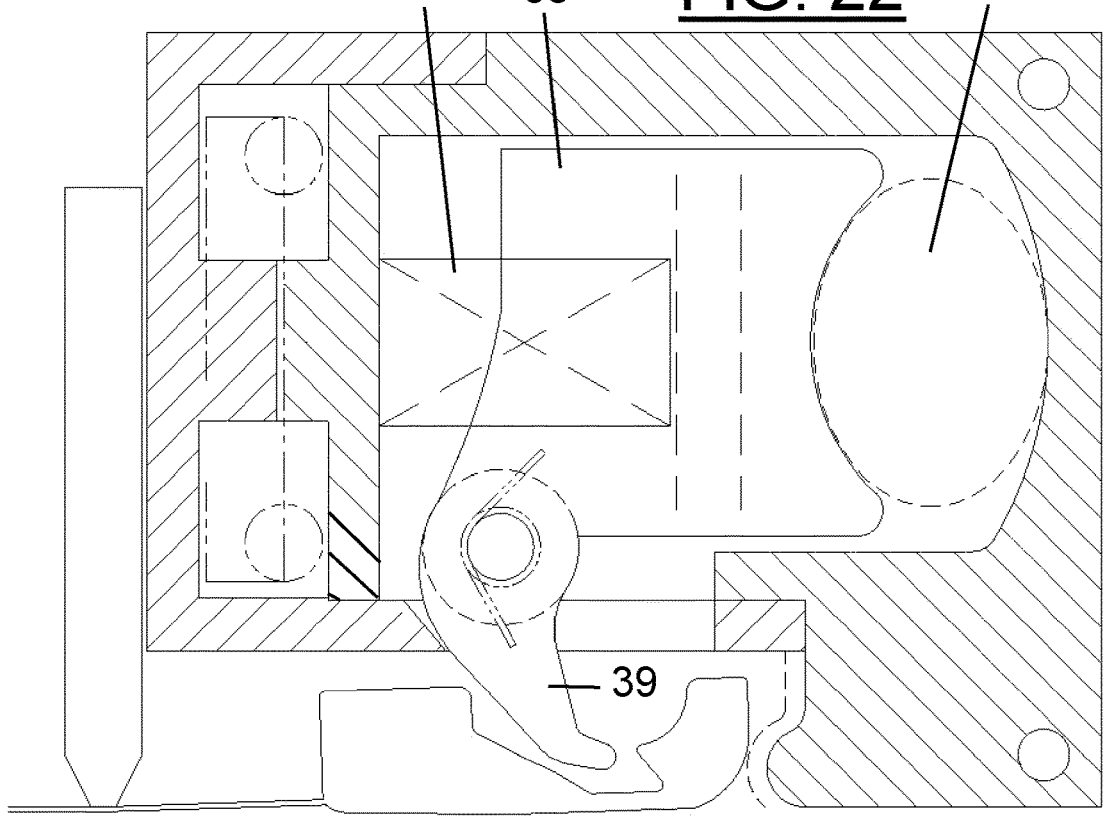

An exemplary loading sequence for loading a printing screen 3 into a tensioning frame 22 in accordance with the present invention will now be described with reference to FIGS. 20 to 23, each of which schematically shows a sectional view through beam 30C taken along the line B-B of FIG. 5, similar to FIG. 10.

a) As shown in FIG. 20, the loading sequence starts with the tensioning frame 22 in a pre-loading position, in which the blade 33 is raised into its withdrawn position and the tubing 43 is inflated to move the engagement body 35, against the bias of the compression spring, to its leftmost position as shown, i.e. towards the interior region of the tensioning frame 22. In this position, the engagement arm 39 is pushed into its retracted position, against the bias of the torsion spring 41, by the profiled edge 44. With the tensioning frame 22 in this position, a printing screen 3 is inserted laterally through the opening 32 (not visible in FIG. 20). The associated pneumatic supply to the tensioning frame 22 controlled by the pneumatic logic network 69 for this step may be summarised as:

Pneumatic supply to first pneumatic port 65: ON
Pneumatic supply to second pneumatic port 82: OFF b) As shown in FIG. 21, the blade 33 is then lowered to its operational position in which its abutment surface 48 contacts the foil/mesh 15 of the printing screen 3. Although not visible in this Figure, the locking mechanism is engaged to lock the blade 33 at this operational position. The associated pneumatic supply to the tensioning frame 22 controlled by the pneumatic logic network 69 for this step may be summarised as:

Pneumatic supply to first pneumatic port 65: ON
Pneumatic supply to second pneumatic port 82: ON (Positive pressure)

c) As shown in FIG. 22, the tubing 43 starts to deflate, so that the engagement body 35 is impelled to the right by the compression spring 42, and also therefore the engagement arm 39 starts to move towards its extended position. The associated pneumatic supply to the tensioning frame 22 controlled by the pneumatic logic network 69 for this step may be summarised as:

Pneumatic supply to first pneumatic port 65: OFF
Pneumatic supply to second pneumatic port 82: OFF d) As shown in FIG. 23, the tubing 43 is fully deflated, so that the engagement body 35 is impelled fully to the right, enabling the engagement arm 39 to move into its extended position so that its engagement surface 47 contacts an inclined surface 71 of the edging 16. The complementary angles of the engagement surface 47 and inclined surface 71 ensure engagement of the printing screen 3 and the tensioning frame 22. The edging 16 is pushed into full contact with the leaf spring 46 of the profiled section 45, which acts to cam the edging 16 upwards. The printing screen 3 is now fully engaged and tensioned, so that a printing operation may be performed. The associated pneumatic supply to the tensioning frame 22 controlled by the pneumatic logic network 69 for this step may be summarised as:

Pneumatic supply to first pneumatic port 65: OFF
Pneumatic supply to second pneumatic port 82: OFF It will be understood from the above that the printing screen 3 remains loaded and tensioned in the tensioning frame 22 without the need to maintain pneumatic pressure to the tensioning frame 22. Therefore, a loaded tensioning frame 22 may be readily stored, transported or loaded into a printing machine as required.

It should be noted that while the above-described tensioning frames 22 can be loaded from the side as described above, this is not essential, and printing screens 3 can optionally be loaded in a similar way as to prior VectorGuard-style tensioning frames, i.e. by placing a printing screen 3 onto the underside of the tensioning frame 22 while in the state shown in FIG. 20, and then performing the same loading steps b) to d) as set out previously, followed by a step of inverting the loaded tensioning frame to arrive at the working orientation as shown in FIG. 23. Alternatively, a printing screen may be placed onto a surface and the tensioning frame then placed on top of the printing screen 3 while in the working orientation, i.e. as shown in FIG. 20, and the same loading steps b) to d) as set previously then performed. These loading methods may be facilitated by the conformal surface, for example the shape of leaf spring 46 would assist in centring the printing screen when loaded in these ways. It will also be recognised by those skilled in the art that these loading methods are facilitated through the provision of the engagement arm 39 which is movably mounted to a respective engagement body 35; since insertion of the printing screen 3 is performed while the engagement body 35 is moved into its leftmost position by inflation of the tubing 43, and in this position the engagement arm 39 is in its retracted position, it is thereby ensured that the engagement arm 39 is retracted during loading of a printing screen 3. Therefore any risk of the engagement arm being snagged or positioned incorrectly with respect to the printing screen edging 16 is removed. This benefit is achievable in embodiments in which the tensioning frame is not provided with an opening in a side thereof to permit lateral loading of a printing screen 3.

Being able to load the tensioning frames 22 in any of these ways greatly increases flexibility for the end-user, for example if the end-user does not have ready access to a loading robot or AIV.

D. Exemplary Unloading Sequence

Figure 27:
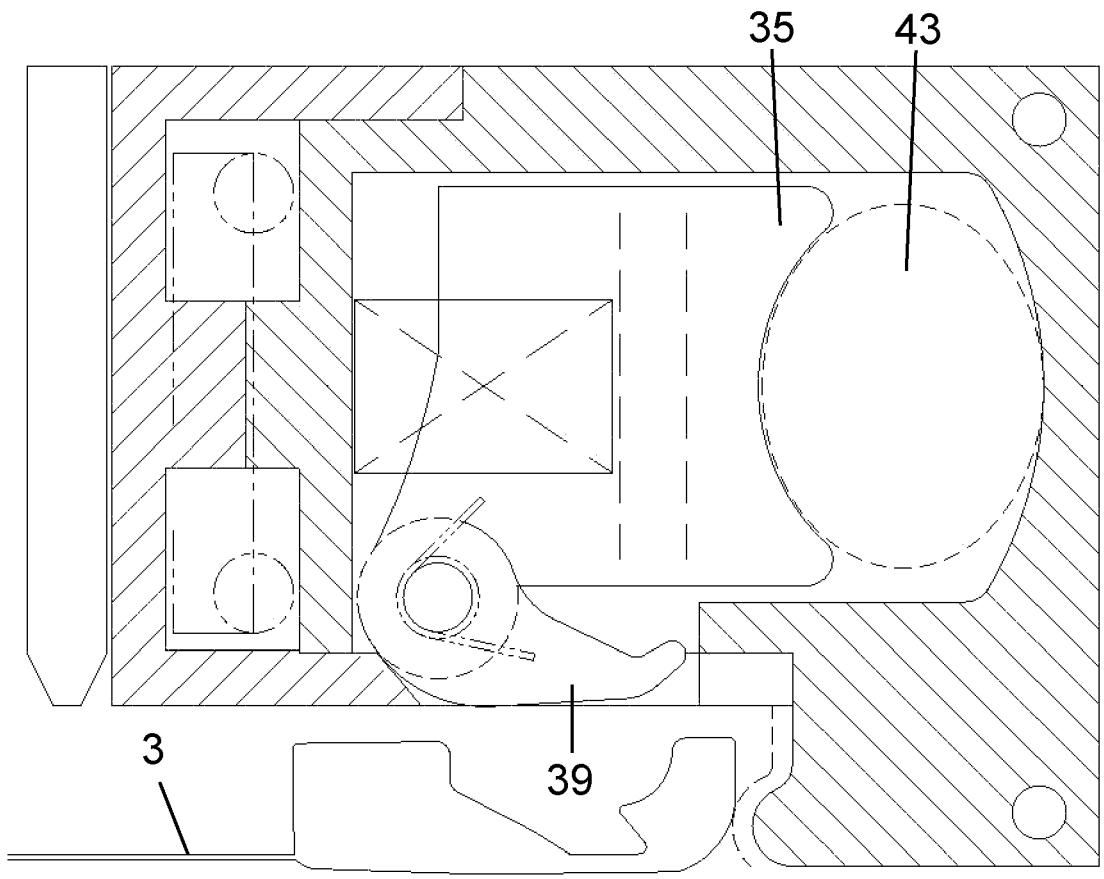
Figure 28:
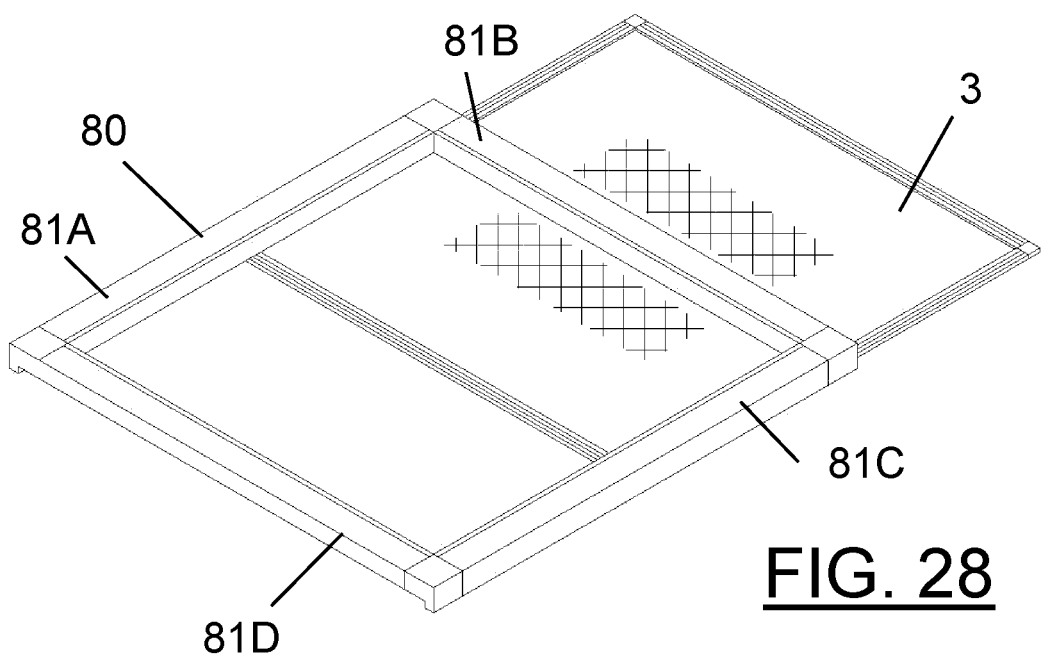
FIG. 28 schematically shows a in perspective view, a tensioning frame according to another embodiment of the present invention.

An exemplary unloading sequence for unloading a printing screen 3 from the tensioning frame 22 in accordance with the present invention will now be described with reference to FIGS. 24 to 27, each of which schematically shows a sectional view through beam 30C taken along the line B-B of FIG. 5, similar to FIG. 10.

e) As shown FIG. 24, the locking mechanism (not shown) is disengaged and the blade 33 is raised towards its withdrawn position while the engagement arm 39 continues to tension the printing screen 3. The associated pneumatic supply to the tensioning frame 22 controlled by the pneumatic logic network 69 for this step may be summarised as:
Pneumatic supply to first pneumatic port 65: OFF
Pneumatic supply to second pneumatic port 82: ON (Negative pressure)

f) As shown in FIG. 25, the blade 33 is fully raised to its withdrawn position, and the tubing 43 starts to inflate, moving the engagement body 35 to the left against the bias of the compression spring 42. The engagement surface 47 moves out of contact with the inclined surface 71, releasing tension in the printing screen 3. The associated pneumatic supply to the tensioning frame 22 controlled by the pneumatic logic network 69 for this step may be summarised as:
Pneumatic supply to first pneumatic port 65: ON
Pneumatic supply to second pneumatic port 82: ON (Negative pressure)

g) As shown in FIG. 26, the tubing 43 is almost fully inflated, the engagement body 35 is pushed almost fully to the left, and the engagement arm 39 starts to rotate towards its retracted position due to its impact with the profiled edge 44. The associated pneumatic supply to the tensioning frame 22 controlled by the pneumatic logic network 69 for this step may be summarised as:
Pneumatic supply to first pneumatic port 65: ON
Pneumatic supply to second pneumatic port 82: OFF h) As shown in FIG. 27, the tubing 43 is fully inflated, the engagement body 35 is fully pushed to the left and the engagement arm 39 is fully at its retracted position. The printing screen 3 may now be removed via the opening 32. The associated pneumatic supply to the tensioning frame 22 controlled by the pneumatic logic network 69 for this step may be summarised as:
Pneumatic supply to first pneumatic port 65: ON
Pneumatic supply to second pneumatic port 82: OFF FIG. 28 schematically shows, in perspective view, a tensioning frame 80 according to another embodiment of the present invention, with a partly unloaded printing screen 3. Similarly to the previously described embodiment, tensioning frame 80 comprises four beams, 81A-D, with an opening in beam 80D to permit a printing screen 3 to be loaded or unloaded therethrough. However, in this embodiment, a second opening is provided in beam 81B, so that a printing screen 3 may alternatively be loaded or unloaded therethrough. This type of tensioning frame permits the possibility of a loading a printing screen 3 into the tensioning frame while it is in a printing machine using a robot such as an AIV from a first side of the printing machine, and subsequently unloading the printing screen 3 from the tensioning frame 80 from a robot such as an AIV from the opposite side of the printing machine. This type of configuration may provide faster changeover of printing screens, since a new printing screen can be loaded as soon as the previous one is unloaded. In addition, a loading AIV may be kept clean since it only handles clean printing screens, while the unloading AIV may be kept as a soiled or disposal AIV, only handling used printing screens.

The above-described embodiments are exemplary only, and other possibilities and alternatives within the scope of the invention will be apparent to those skilled in the art.

For example, while the embodiments described above use an AIV to load and unload the printing screens, other forms of robot may be used, such as fixed robotic arms.

In the above-described embodiments, the locking mechanism comprises a locking pin which is directly driven into and out of engagement with the blade 33 by a camming surface of rotor 53. The locking mechanism could however be effected in a number of different ways, as will be recognised by those skilled in the art, such as using a dedicated actuation mechanism to move the locking pin 63 into locking engagement with the blade 33, or by using spring-loaded bearings or the like. As a further alternative, the locking mechanism could comprise a latching mechanism. With such an arrangement, as will be appreciated by those skilled in the art, rotation of the rotor 53 in a first rotational direction past a certain rotation angle may cause the locking mechanism to latch into a locked position. To unlock the locking mechanism, the rotator 53 would then be driven a small angle in the same (i.e. the first) rotational direction, causing the locking mechanism to unlatch and thus allow the blade 33 to raise to its withdrawn position when the rotor 53 is subsequently rotated in the opposite rotational direction.

With such a latching mechanism, it is possible to use an alternative driving arrangement for the first and second actuating members 55, 56, and hence the rotor 53. In particular, the embodiments shown above use a simple piston 84 drivable back and forth by selectively applying positive and negative pneumatic pressure to second pneumatic port 82, and hence the first and second actuating members 55, 56. However, if a latching locking mechanism is employed then the simple pistons 84 may be replaced by spring-return pistons which require only the application of positive pneumatic pressure to second pneumatic port 82, to drive the spring-return pistons and hence the first and second actuating members 55, 56 and rotor 53 from their original positions (in which the blade 33 is in its withdrawn position) to effect latching and unlatching. Once unlatched, the pneumatic supply may be switched to OFF by the pneumatic logic network 69, allowing the spring-return to then return the pistons, first and second actuating members 55, 56 and rotor 53 back to their original positions.

In the above-described embodiments, both the actuator for moving the engagement body and the first and second actuating members are pneumatic, it is equally possible to use other forms of actuation, in particular electric actuation using electric actuators such as rotary or linear motors may be used for either or both of these components. If electrical actuation is used, then the pneumatic logic described previously may be replaced by suitably programmed electronic logic, as is well-known in the art per se.

Furthermore, if pneumatic actuation is used to move the engagement body, then other pneumatic actuators such as pneumatic pistons or cylinders may be used.

While the motion converting mechanism described above uses a slotted link mechanism, other forms of motion-converting mechanism are equally possible, such as, for example, a Geneva or Swiss mechanism. A mechanically simple variation may use a rack and cog mechanism, with the racks replacing the actuating members being moved linearly along the length of each beam, and the cog replacing the rotor described above.

While the tensioning frames described herein have been illustrated with respect to the loading of known VectorGuard-type printing screens, tensioning frames in accordance with the present invention could equally be used, or readily adapted for use, with other printing screens which include edging with a profile or structure provided to enable interaction with an engagement mechanism.

REFERENCE NUMERALS USED

1—Tensioning frame
2A-D—Beams
3—Printing screen
4—Corner pieces
5—Engagement surfaces
6—Channel opening
7—Engagement body
8—First arm
9—Spring
10—Second arm
11—Pneumatically inflatable tubing
12—Third arm
13—Pneumatic port
14—Spindle
15—Foil/mesh
16—Edging
17—Projection
18—Abutment surface
20—AIV
21—Printing machine
22—Tensioning frame
23, 24, 24A—Printing screens
25—Printing volume
26—Hatch
27—Clamping rails
28—Empty slot
30A-D—Beams
31A-D—Corner blocks
32—Opening
33—Blade
34—Bar
35—Engagement body
36—Bridges
37—Beam body
38—Beam cover
39—Engagement arm
40—Pivot
41—Torsion spring
42—Compression spring
43—Tubing
44—Profiled edge
45—Profiled section
46—Leaf spring
47—Engagement surface
48—Abutment surface
49—Motion converting mechanism
50—Void
51—Plate
52—Drive pin
53—Rotor
54—Slot
55—First actuating member
56—Second actuating member
57—Bore
58, 59—Pivot pins
60—Aperture
61, 62—Actuator bores
63—Locking pin
64—Locking spring
65—First pneumatic port
66A-D—Pneumatic lines
67—Connection
68—Pneumatic line
69—Pneumatic logic network
70—Male projection
71—Inclined surface
80—Tensioning frame
81A-D—Beams
161—Edging corner pieces
82—Second pneumatic port
83—Junction
84—Piston
85—Pneumatic source
86—Control means
87—Printing machine
88—Transfer mechanism
A—Loading direction
R—Rotary axis

The invention claimed is:

1. A tensioning frame for tensioning a printing screen, the tensioning frame comprising: a plurality of elongate beams which extend around the periphery of the tensioning frame and define the tensioning frame, the tensioning frame being substantially planar, wherein at least one of the beams comprises an opening in a lateral side thereof which is dimensioned to permit a printing screen to be received therethrough in a direction parallel to the plane of the tensioning frame, and wherein each beam comprises a blade which is movable along a range of travel in a direction normal to the plane of the tensioning frame, between a withdrawn position in which the blade is spaced from the printing screen in use and an operational position in which the blade contacts the printing screen in use.

2. The tensioning frame of claim 1, wherein each beam comprises:
an engagement body at least partially located within the beam, the engagement body carrying an engagement surface for engaging with a printing screen in use, the engagement body being movable relative to the beam along a range of travel in a plane normal to the length of the beam; and
an actuator operatively connected to the engagement body for moving the engagement body, and hence engagement surface, relative to the beam.

3. The tensioning frame of claim 2, wherein the plurality of beams define an interior region of the tensioning frame in which a central region of a printing screen is located in use, and the actuator is operative to move the engagement body in a direction towards the interior region.

4. The tensioning frame of claim 2, wherein each engagement surface is formed on a respective engagement arm, which is movably mounted to a respective engagement body, the engagement arm being movable relative to the engagement body between a retracted position to permit a printing screen to be fully inserted into the tensioning frame in use and an extended position in which the engagement surface may contact a printing screen in use.

5. The tensioning frame of claim 4, wherein the engagement arm is tensioned into the extended position.

6. The tensioning frame of claim 1, wherein each beam includes a profiled section to impel an edge of the printing screen towards said beam in use.

7. The tensioning frame of claim 1, wherein each beam comprises:
a respective actuating member which is movable along the length of the respective beam; and
a respective motion converting mechanism operative to convert the movement of the respective actuating member to movement normal to the plane of the tensioning frame, arranged such that the movement of each blade in use is driven by the respective actuating member via the respective motion converting mechanism.

8. The tensioning frame of claim 7, wherein each respective motion converting mechanism comprises a slotted link mechanism or a Geneva mechanism.

9. The tensioning frame of claim 1, comprising a lock for locking the blade at the operational position.

10. A tensioning frame for tensioning a printing screen, the tensioning frame comprising a plurality of elongate beams which extend around the periphery of the tensioning frame and define the tensioning frame, the tensioning frame being substantially planar, each beam comprising:
an engagement body at least partially located within the beam, the engagement body carrying an engagement arm for engaging with a printing screen in use, the engagement body being movable with respect to the beam along a range of travel in a plane normal to the length of the beam; and
an actuator operatively connected to the engagement body for moving the engagement body, and the hence engagement arm, relative to the beam,
wherein the engagement arm is movably mounted to a respective engagement body such that the engagement arm is movable relative to the engagement body.

11. The tensioning frame of claim 10, wherein each engagement arm is pivotably or slidably mounted to a respective engagement body.

12. The tensioning frame of claim 10, wherein the actuator comprises at least one actuator from the group consisting of pneumatic actuator, pneumatic piston, and electric actuator.

13. The tensioning frame of claim 10, wherein the plurality of beams define an interior region of the tensioning frame in which a central region of a printing screen is located in use, and the actuator is operative to move the engagement body in a direction towards the interior region.

14. A method of loading a printing screen into a tensioning frame, comprising the steps of:
i) providing a tensioning frame, and
ii) inserting a printing screen into the tensioning frame through a side thereof;
wherein the tensioning frame is substantially planar and comprises an opening in a lateral side thereof, dimensioned to receive the printing screen in a direction parallel to the plane of the tensioning frame, and
wherein the tensioning frame comprises:
a plurality of elongate beams which extend around the periphery of the tensioning frame and define the tensioning frame, the tensioning frame being substantially planar,
an engagement body at least partially located within a beam, the engagement body carrying an engagement arm for engaging with a printing screen in use, the engagement body being movable relative to said beam along a range of travel in a plane normal to the length of said beam, and
wherein the engagement arm is movably mounted to a respective engagement body,
and wherein step i) comprises moving the engagement arm relative to the engagement body into a retracted position in which, in step ii), the printing screen may be fully inserted into the tensioning frame without contacting the engagement arm.

15. The method of claim 14, wherein step ii) comprises using a robot.

16. The method of claim 14, further comprising an initial step of locating the tensioning frame within a printing machine.

* * * * *